United States Patent
Fisch

(10) Patent No.: US 8,618,647 B2
(45) Date of Patent: Dec. 31, 2013

(54) PACKAGED MICROELECTRONIC ELEMENTS HAVING BLIND VIAS FOR HEAT DISSIPATION

(75) Inventor: David Edward Fisch, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 6 days.

(21) Appl. No.: 13/195,786

(22) Filed: Aug. 1, 2011

(65) Prior Publication Data
US 2013/0032934 A1 Feb. 7, 2013

(51) Int. Cl.
*H01L 23/02* (2006.01)

(52) U.S. Cl.
USPC ............... 257/686; 257/777; 257/E25.013

(58) Field of Classification Search
None
See application file for complete search history.

(56) References Cited

U.S. PATENT DOCUMENTS

| | | | | |
|---|---|---|---|---|
| 4,737,112 A | * | 4/1988 | Jin et al. | 439/66 |
| 4,995,551 A | * | 2/1991 | MacKay | 228/177 |
| 5,076,485 A | * | 12/1991 | MacKay | 228/177 |
| 5,225,966 A | * | 7/1993 | Basavanhally et al. | 361/774 |
| 5,242,097 A | * | 9/1993 | Socha | 228/56.3 |
| 5,411,602 A | * | 5/1995 | Hayes | 148/23 |
| 5,483,106 A | * | 1/1996 | Echigo et al. | 257/783 |
| 5,556,023 A | * | 9/1996 | Kuramoto et al. | 228/248.1 |
| 5,567,648 A | * | 10/1996 | Gupta | 438/616 |
| 5,661,042 A | * | 8/1997 | Fang et al. | 438/17 |
| 5,688,584 A | * | 11/1997 | Casson et al. | 428/209 |
| 5,713,997 A | * | 2/1998 | Kuramoto et al. | 106/287.18 |
| 5,720,843 A | * | 2/1998 | Lee | 156/276 |
| 5,727,310 A | * | 3/1998 | Casson et al. | 29/830 |
| 5,736,074 A | * | 4/1998 | Hayes et al. | 264/6 |
| 5,750,271 A | * | 5/1998 | Kuramoto et al. | 428/624 |
| 5,820,014 A | * | 10/1998 | Dozier et al. | 228/56.3 |
| 5,846,366 A | * | 12/1998 | Jin et al. | 156/233 |
| 5,928,440 A | * | 7/1999 | Kuramoto et al. | 148/24 |
| 5,957,364 A | * | 9/1999 | Socha | 228/56.3 |
| 6,012,626 A | * | 1/2000 | Antao | 228/254 |
| 6,077,380 A | * | 6/2000 | Hayes et al. | 156/283 |
| 6,340,113 B1 | * | 1/2002 | Avery et al. | 228/248.5 |
| 6,476,487 B2 | * | 11/2002 | Kuramoto et al. | 257/738 |
| 6,501,663 B1 | * | 12/2002 | Pan | 361/779 |
| 6,537,852 B2 | * | 3/2003 | Cohn et al. | 438/109 |
| 6,802,446 B2 | * | 10/2004 | Chaudhuri et al. | 228/248.1 |
| 7,157,787 B2 | * | 1/2007 | Kim et al. | 257/621 |

(Continued)

FOREIGN PATENT DOCUMENTS

EP  0685879 A1 * 6/1995
JP  63174337 A * 7/1988 ............. H01L 21/92

(Continued)

*Primary Examiner* — David E Graybill

(57) ABSTRACT

System and method for thermal management in a multi-chip packaged device. A microelectronic unit is disclosed, and includes a semiconductor element having a top surface and a bottom surface remote from the top surface. A semiconductor device including active elements is located adjacent to the top surface. Operation of the semiconductor device generates heat. Additionally, one or more first blind vias extend from the bottom surface and partially into a thickness of the semiconductor element. In that manner, the blind via does not contact or extend to the semiconductor device (defined as active regions of the semiconductor element, and moreover, is electrically isolated from the semiconductor device. A thermally conductive material fills the one or more first blind vias for heat dissipation. Specifically, heat generated by the semiconductor device thermally conducts from the semiconductor element, and is further distributed, transferred and/or dissipated through the one or more first blind vias to other connecting components.

12 Claims, 19 Drawing Sheets

(56) References Cited

U.S. PATENT DOCUMENTS

| | | | |
|---|---|---|---|
| 7,163,885 B2* | 1/2007 | Chen et al. | 438/613 |
| 7,265,449 B2* | 9/2007 | Park et al. | 257/773 |
| 7,504,331 B2* | 3/2009 | Fork et al. | 438/610 |
| 7,525,194 B2* | 4/2009 | Fork et al. | 257/738 |
| 7,550,846 B2* | 6/2009 | Knights | 257/738 |
| 7,642,130 B2* | 1/2010 | Nakabayashi | 438/108 |
| 7,662,708 B2* | 2/2010 | Fork et al. | 438/613 |
| 7,829,975 B2* | 11/2010 | Hayasaka et al. | 257/621 |
| 8,053,277 B2* | 11/2011 | Yu et al. | 438/108 |
| 8,174,093 B2* | 5/2012 | Hayasaka et al. | 257/621 |
| 8,283,755 B2* | 10/2012 | Hayasaka et al. | 257/621 |
| 8,310,033 B2* | 11/2012 | Jin et al. | 257/621 |
| 8,391,016 B2* | 3/2013 | Hwang | 361/760 |
| 2001/0020744 A1* | 9/2001 | Kuramoto et al. | 257/738 |
| 2003/0038373 A1* | 2/2003 | Cohn et al. | 257/777 |
| 2003/0075811 A1* | 4/2003 | Cohn et al. | 257/777 |
| 2005/0048697 A1* | 3/2005 | Uang et al. | 438/108 |
| 2005/0150684 A1* | 7/2005 | Hashimoto | 174/256 |
| 2006/0038298 A1* | 2/2006 | Park et al. | 257/772 |
| 2007/0023907 A1* | 2/2007 | Fork et al. | 257/738 |
| 2007/0023908 A1* | 2/2007 | Fork et al. | 257/738 |
| 2007/0023909 A1* | 2/2007 | Fork et al. | 257/738 |
| 2007/0096263 A1* | 5/2007 | Furukawa et al. | 257/621 |
| 2008/0213613 A1* | 9/2008 | Kuramoto et al. | 428/577 |
| 2009/0020855 A1* | 1/2009 | Pyeon | 257/621 |
| 2009/0283904 A1* | 11/2009 | Ali et al. | 257/737 |
| 2011/0121433 A1* | 5/2011 | Kim | 257/621 |
| 2011/0297433 A1* | 12/2011 | Kuramoto et al. | 174/263 |
| 2011/0298097 A1* | 12/2011 | Sueyoshi et al. | 257/621 |
| 2012/0032352 A1* | 2/2012 | Huening | 257/782 |
| 2013/0032934 A1* | 2/2013 | Fisch | 257/698 |

FOREIGN PATENT DOCUMENTS

| | | | | |
|---|---|---|---|---|
| JP | 05074542 A | * | 3/1993 | H01R 43/02 |
| JP | 05198933 A | * | 8/1993 | H05K 3/34 |
| JP | 07246492 A | * | 9/1995 | B23K 35/14 |
| JP | 2007294733 A | * | 11/2007 | |

* cited by examiner

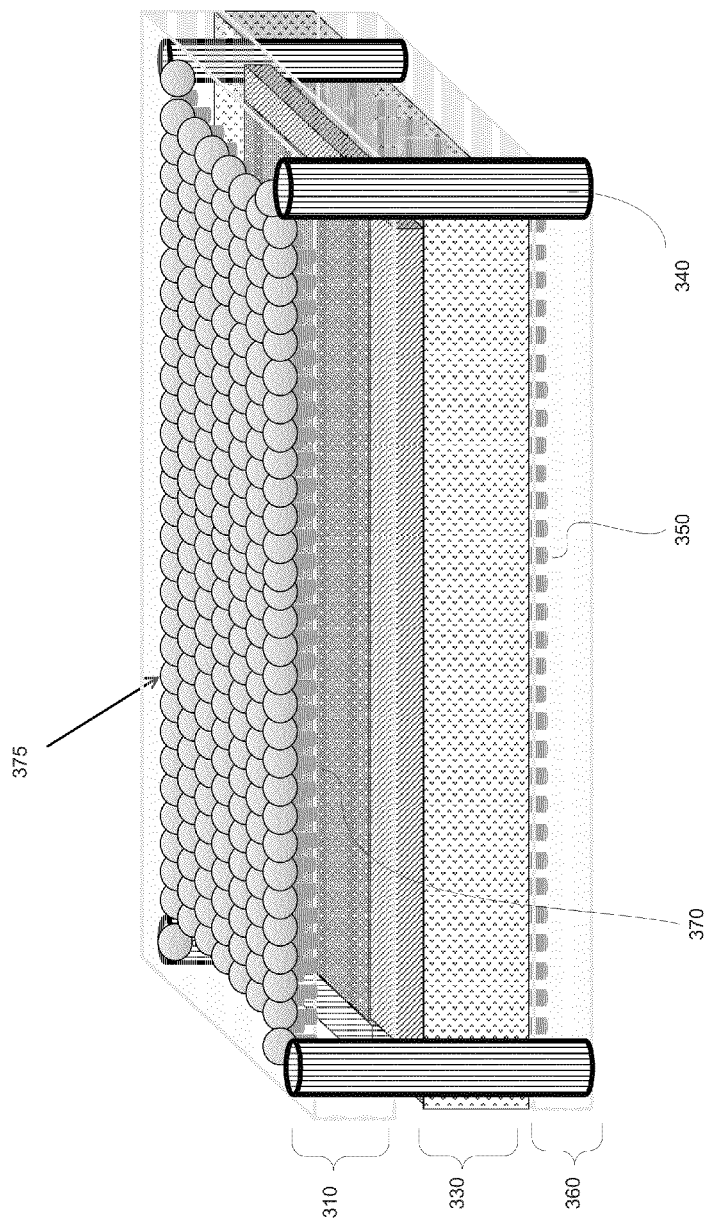

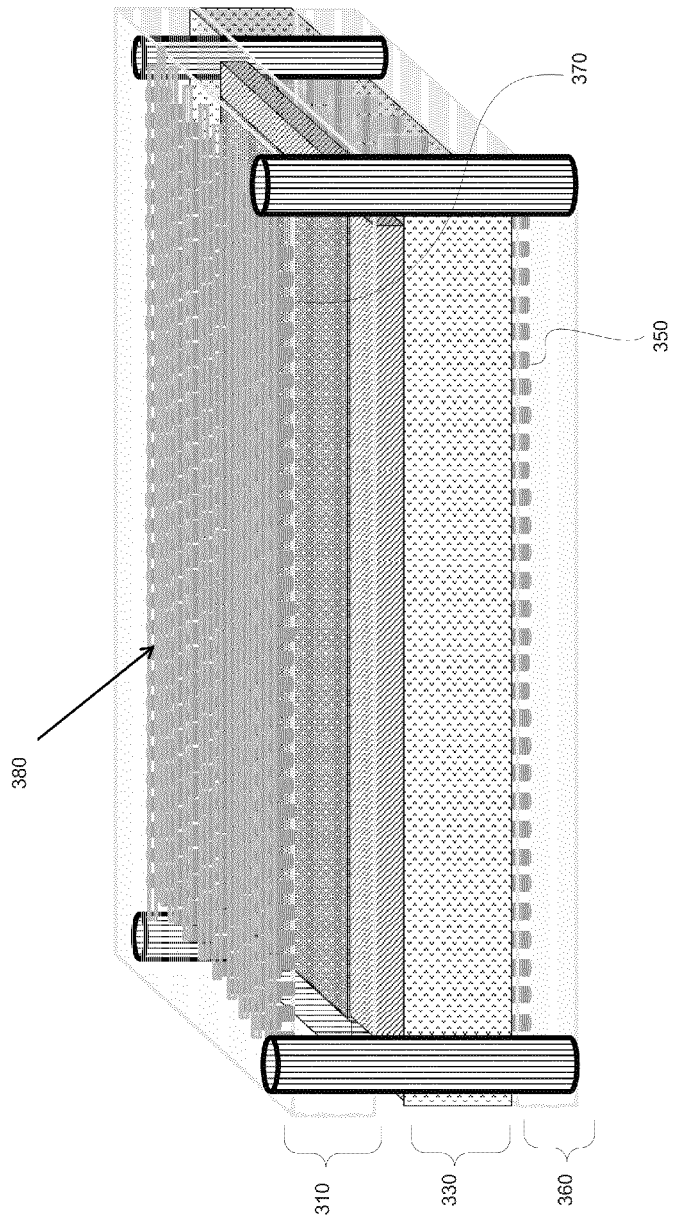

PACKAGED MICROELECTRONIC ELEMENTS HAVING BLIND VIAS FOR HEAT DISSIPATION

BACKGROUND

Microelectronic devices utilize semiconductor integrated circuits which incorporate numerous electronic components. These circuits consist of numerous circuit elements, such as, transistors and resistors, electrically connected to perform various functionality. Typically, the circuit is mounted on a substrate which physically supports the integrated circuit and helps to electrically interconnect elements of the circuit. The substrate may be part of a discrete chip package used to hold a single chip or integrated circuit.

The chip may be mounted on a printed circuit board (PCB) or other platform used for interconnecting one or more chips together and to other electronic components. Connections may be made through conductive pathways, wire bonding or wrapping, etc. The design and layout of the components on a PCB are important to increase functionality associated with the components. The higher the number of electronic components that are interconnected, the greater the functionality associated with those components. However, there is only so much real estate on a PCB.

To achieve additional functionality without significantly increasing the size of the PCB, one or more chips containing integrated circuits may be mounted on top of each other within a single semiconductor package. This stacking of chips increases the amount of circuitry available on a PCB, and further simplifies the board assembly process. For example, four or more chips may be stacked together to provide varying functionality, such as, memory, logic, analog, mixed signal technologies. As a result, board design is able to take advantage of horizontal and vertical integration of chips.

However, chip operation inherently generates heat. The electrical power dissipated throughout a chip tends to heat the chip and its corresponding substrate. As the device is turned on, operates, and then turns off, numerous heating and cooling cycles affect the chip. That is, the temperature of the chip and substrate will rise and fall throughout the life of the integrated circuit. This leads to thermal expansion and contraction of the chip and substrate. As a result, components may become damaged, become dislodged, and become disconnected from other elements.

As more and more chips are stacked within a package, heat dissipation becomes an even more critical issue. Thus, a package should be capable of dissipating the heat generated by the operation of the enclosed chips, so as to limit the temperature rise of chips within the semiconductor chip package.

SUMMARY

Embodiments of the present invention generally relate to multi-chip packaged semiconductor devices and thermal management within the package. In particular, each semiconductor chip includes blind vias that extend towards the active semiconductor layer from either the top or bottom of the chip. The blind vias do not extend fully to the active semiconductor layer, but remain in the layers adjacent to and surrounding the active semiconductor layer. In that manner, heat generated through operation of the active semiconductor layer is dissipated through the adjacent and surrounding layers, and further dissipated through the blind vias. The thermal energy may then be conducted externally to the package using through silicon vias (TSVs), interconnects, and external terminals.

In one embodiment, a microelectronic unit is disclosed, and includes a semiconductor element having a top surface and a bottom surface remote from the top surface. For instance, the semiconductor element is a semiconductor substrate. A semiconductor device is located adjacent to the top surface. For instance, the device includes one or more active components, such as, a memory array. Operation of the semiconductor device generates heat. Additionally, one or more first blind vias extend from the bottom surface and partially into a thickness of the semiconductor element. In that manner, the blind via does not contact the semiconductor device, and moreover, is electrically isolated from the semiconductor device. A thermally conductive material fills the one or more first blind vias for heat dissipation. Specifically, heat generated by the semiconductor device flows to the semiconductor element, and then is further dissipated through the one or more first blind vias and to other connecting components.

In another embodiment, a multi-chip packaged unit is disclosed and includes a plurality of semiconductor chips stacked and joined together. At least one chip is configured for heat dissipation according to embodiments of the present invention. Specifically, the at least one chip includes a semiconductor element having a top surface and a bottom surface remote from the top surface. A semiconductor device is adjacent to the top surface. The device includes one or more active components, such as, in a memory array. Additionally, one or more first blind vias extend from the bottom surface and partially into a thickness of the semiconductor element. In that manner, the blind via does not contact the semiconductor device, and moreover, is electrically isolated from the semiconductor device. A thermally conductive material fills the one or more first blind vias for heat dissipation. Specifically, heat generated by the semiconductor device flows to the semiconductor element, and then is further dissipated through the one or more first blind vias and to other connecting components.

In another embodiment, a method for performing thermal management in a microelectronic unit is disclosed. The method includes forming a semiconductor element having a first surface and a second surface remote from the first surface. A semiconductor device is formed adjacent to the first surface. A blind via is formed and extends from the second surface and partially into a thickness of the semiconductor element. The blind via is filled with thermally conductive material for heat dissipation. For instance, heat generated by the semiconductor device flows to the semiconductor element, and then is further dissipated externally from the microelectronic unit through the blind via, and to other connecting components.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 3C is a perspective view of a microelectronic device including two sets of blind vias for heat dissipation and solder balls electrically connected to a second set of blind vias disposed in a dielectric layer located adjacent to a top surface of a semiconductor device for thermally conducting heat away from the microelectronic unit, in accordance with one embodiment of the present disclosure.

FIG. 3E is a perspective view of a microelectronic device including two sets of blind vias for heat dissipation and a redistribution layer (RDL) electrically connected to a first set of blind vias disposed in a dielectric layer located adjacent to a top surface of a semiconductor device for thermally conducting heat away from the microelectronic unit, in accordance with one embodiment of the present disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Accordingly, embodiments of the present disclosure illustrate a multi-chip packaged device, in which multiple chips are stacked on top of each other in various configurations within a single semiconductor package. More particularly, embodiments of the present invention are directed to the dissipation of heat generated by the active components of the various chips, using blind vias formed within each of the semiconductor chips. Specifically, a semiconductor chip assembly or configuration is disclosed having blind vias extending through insulating layers of the chip but not extending through to an active semiconductor layer. In that manner, heat generated by the active semiconductor layer is dissipated externally from the chip using the blind vias. The heat may be further dissipated using interconnects to dissipate the heat externally from the packaged device. As such, embodiments of the present invention are able to control temperature swings within a multi-chip packaged device, thereby leading to better performance of the components on the chips.

Figure 1A:
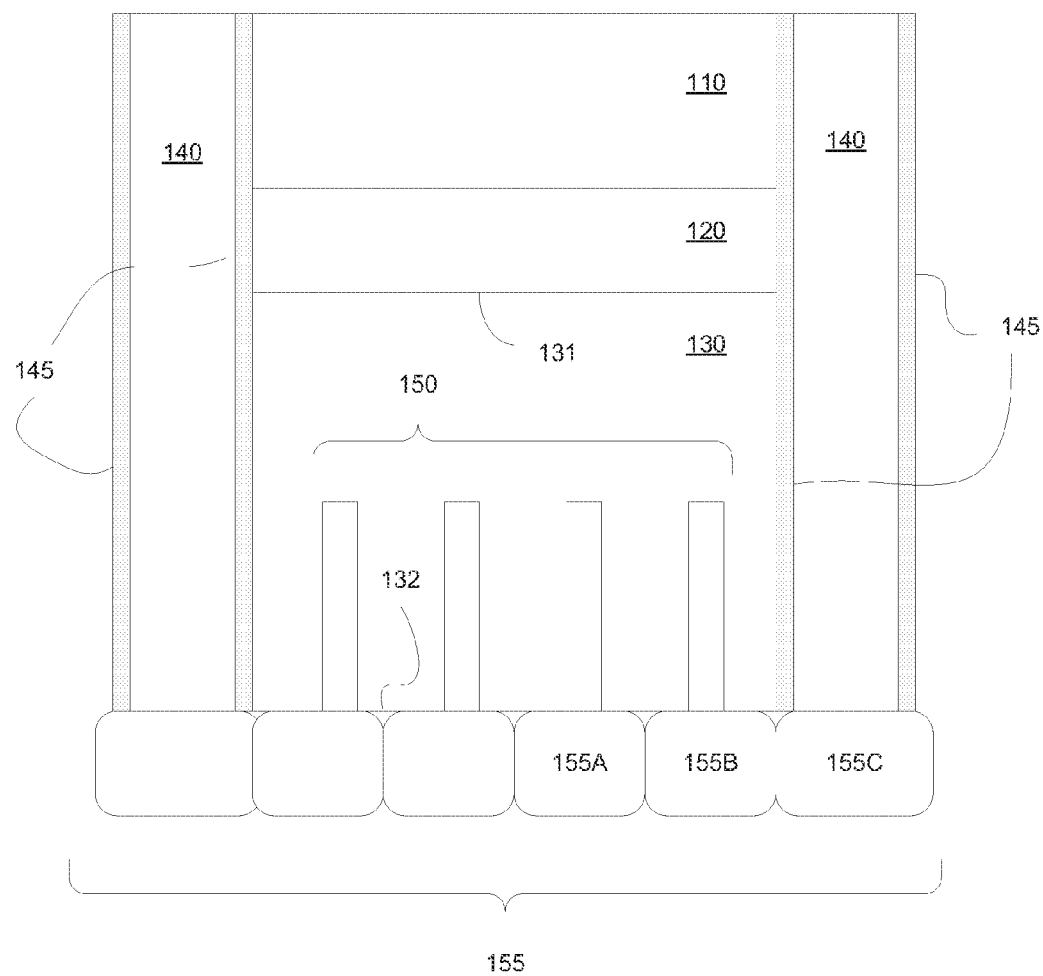
FIG. 1A is a cross-sectional view of a microelectronic device including one or more blind vias for purposes of heat dissipation, in accordance with one embodiment of the present disclosure.

FIG. 1A is a cross-sectional view of a microelectronic unit or device 100A including one or more blind vias for purposes of heat dissipation, in accordance with one embodiment of the present disclosure. That is, heat or thermal energy generated by active elements in the device 100A is distributed and dissipated externally from the chip assembly in device 100A. That heat can then be further distributed externally from a package containing the device 100A.

As shown in FIG. 1A, the microelectronic unit 100A in accordance with one embodiment of the present invention incorporates a semiconductor element 130 having a top surface 131 and a bottom surface 132 remote from the top surface. The use of the terms "top" and "bottom" is not intended to strictly limit the structure of the element 130, and is intended to generally show that both surfaces are remote from each other, in embodiments of the invention. For instance, the surfaces 131 and 132 are equally referenced using other generically identifying terms, such as, first surface 131 and second surface 132. In one implementation, the semiconductor element 130 is a silicon substrate upon which other elements, devices, layers etc. are disposed.

A semiconductor device 120 is disposed adjacent to, above, or in the top surface 131 of the semiconductor element 130. More particularly, semiconductor device 120 is formed from or disposed above semiconductor element 130. For instance, a top region of semiconductor element 130 may be modified to form semiconductor device 120 through process steps including implants, etches, and deposition. As such, semiconductor device 120 is formed in or above element 130. For purposes of clarity, semiconductor element 130 can be defined as the region that does not contain active regions and device 120 can be defined as the region containing the active devices, and in that manner the two regions can be viewed as being adjacent.

For illustration, the semiconductor device 120 could be a conventional semiconductor chip, such as, a memory array that includes a plurality of memory components of varying types. In one implementation, the memory components are dynamic random access memory (DRAM) circuits. In another implementation, the memory components are flash memory. In other implementations, the regions defining the semiconductor device 120 could provide varying functionality, including logic, analog, mixed-signal, etc.

Through normal operation, semiconductor device 120 generates heat that is dissipated throughout the device 120. When device 120 is operating at full capacity, excess heat needs to be further distributed away from the device 120 to reduce component damage. The heat generated from semiconductor device 120 is further distributed, transferred, and/or dissipated to adjacent and surrounding layers, such as, semiconductor element 130. This transfer of heat to the surrounding layers may be considered a passive transfer as no conductive elements are purposefully used to transfer the heat.

Furthermore, one or more first blind vias 150 are formed within the semiconductor element 130 to actively and conductively distribute, transfer, and/or dissipate the heat generated by the semiconductor device 120. The blind vias 150 extend from the bottom surface 132 and into the semiconductor element 130. More specifically, the blind vias 150 extend partially into a thickness 139 of the semiconductor element 130.

The blind vias 150 are of a first type, as referenced in this disclosure. Specifically, blind vias 150 are formed within the semiconductor element 130 near a surface 132 that is disposed remotely from the semiconductor device 120. Blind vias 150 of the first type are distinguished from blind vias 370 of a second type that are formed within another semiconductor element disposed adjacent to, on, or within a surface of the semiconductor device 120 opposite to the semiconductor element 130, as will be described in relation to FIG. 3A below.

In one embodiment, the blind vias 150 are filled with thermally conductive material for heat dissipation. That is, heat generated by device 120 and collected in semiconductor element 130 is actively and/or purposefully distributed, transferred, and/or dissipated away from the element 130 through the thermally conductive blind vias 150. Furthermore, the heat may be distributed externally from the microelectronic device 100A through leads or traces thermally coupling external elements (e.g., contacts, thermal pathways, etc.) to the blind vias 150.

As shown in FIG. 1A, electrically conductive material 155 is placed in contact with the thermally conductive material. The electrically conductive material 155 is also inherently thermally conductive. In this manner, heat energy collecting and stored in the first blind vias 150, originally generated from the active components in the semiconductor device 120, has a path leading externally away from the microelectronic device 100A. For instance, the electrically conductive material 155 may be solder balls comprised of any suitable type of material.

In one embodiment, the electrically conductive material 155 is configured such that adjacent electrically conductive material 155 is in contact. For instance, material 155A and material 155B are in physical contact. In that manner, the heat energy collecting and stored in the first blind vias 150 has additional conductive pathways leading away from the interior of semiconductor device 100A, through the electrically conductive material 155. Because material 155 is thermally conductive, heat may be distributed, transferred, dissipated, and/or conducted to the edges of device 100A.

In one embodiment, the electrically conductive material 155 is configured in a manner such that it forms a mesh structure. As such, as additional first blind vias 155 continue into and out of the plane defined by the cross-section of device 100A, corresponding electrically conductive material 155 disposed at the bottom of those blind vias 155 are in physical contact with adjacent material 155, such as, in a mesh structure. In that manner, heat energy thermally conducting through material 155 can distribute itself throughout the mesh structure horizontally within the previously defined plane, and also into or out of the plane.

In another embodiment, the thermally conductive material filling the first blind vias 150 is also composed of an electrically conductive material. In that manner, the blind vias 150 may be configured to receive electrical signals. As such, any electrical signal received by one of the electrically conductive material 155 is distributed throughout the mesh structure and also in turn distributed throughout the semiconductor element 130 through the blind vias 150. For instance, in one implementation, it may be necessary to send electrical signals into the silicon semiconductor substrate or element 130.

In one embodiment, the semiconductor device also includes another semiconductor element 110. For instance, element 110 may comprise a dielectric material that is protecting the active components in the semiconductor device 120. As such, element 110 is a dielectric layer disposed adjacent the semiconductor device 120 and remote from the semiconductor element 130.

Also shown in FIG. 1A, through silicon vias (TSVs) 140 are disposed adjacent to or within the semiconductor element 130, device 120, and element 110. That is, TSVs 140 extend through the semiconductor device 100A and are used for purposes of thermally conducting heat energy externally away from the semiconductor device 120, and ultimately away from device 100A. For instance, the TSVs are filled with thermally conductive material, for purposes of distributing, transferring, and conducting thermal energy stored in the semiconductor element 130 away from semiconductor device 120.

In one embodiment, TSVs are formed in locations that minimizes chip size of the semiconductor device 110A and allows for separation from active regions, such as, in the middle, sides, corners, etc. of a memory array. TSVs are shown formed at the corners in FIG. 1B for illustration, but could be placed anywhere in the semiconductor device where they can be spaced away from active regions in region 120.

Additionally, one or more second electrically conductive material 155C is in contact with TSVs 140 in order to further conduct thermal energy, generated in device 120 and collected and stored in semiconductor element 130, through the mesh structure 155, to include material 155C, and through TSVs 140. In that manner, the heat energy has a thermally conductive pathway leading externally from semiconductor device 100A to external components thermally coupled to TSVs 140. For instance, externally accessible posts, leads, terminals, traces and contacts, to name a few, are available to further distribute the heat energy. As such, where device 100A is included within a semiconductor package, by coupling the TSVs with terminals leading outside of a package, thermal energy is dissipated away from device 100A and outside of the package.

In one embodiment, TSVs 140 are further encircled with an insulating collar 145. In that manner, TSVs 140 are thermally and electrically isolated from semiconductor device 120, and elements 110 and 130. The ends of the TSVs 140 are exposed for thermal and electrical coupling. In another embodiment, TSVs 140 are not encircled with an insulating collar, and the TSVs are filled with complementary metal-oxide semiconductor (CMOS) compatible materials (e.g., tungsten, etc.). As such, thermal heat energy may dissipate directly from element 130 through adjacent TSVs 140.

Figure 1B:
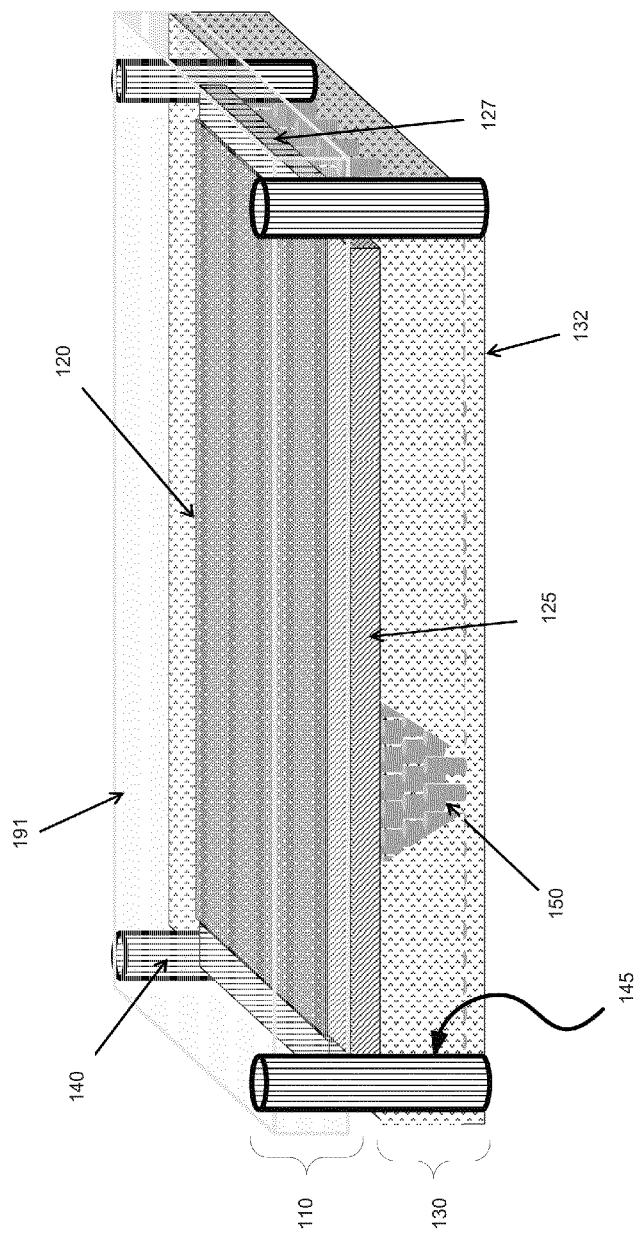
FIG. 1B is a perspective view of a microelectronic device illustrating one or more blind vias used for purposes of heat dissipation, in accordance with one embodiment of the present disclosure.

FIG. 1B a perspective view of a microelectronic device 100B illustrating one or more blind vias used for purposes of heat dissipation, in accordance with one embodiment of the present disclosure. In one embodiment, FIG. 1B is a perspective view of the device 100A of FIG. 1A. For instance, device 100B includes an active region 120. Active region 120 may include transistors and memory cells in some implementations. In the case of a memory array in the active region 120, periphery 125 includes row decoders and row drivers. Also, periphery 127 includes sense amplifiers and column decoders, etc.

The active region 120 is disposed adjacent to a semiconductor element 110, such as, a dielectric. In addition, the active region 120 is disposed adjacent to, on or within semiconductor element 130, such as, a silicon substrate. As such, in one implementation, active region 120 is surrounded by dielectric 110 disposed above, and a silicon substrate 130 disposed below.

Also shown are first blind vias 150 disposed within element 130, and specifically extending from a bottom surface of the element 130 and partially into a thickness of element 130, but not contacting active region 120. The semiconductor element 130 is partially hidden from view to expose the first blind vias 150.

TSVs 140 are shown at the corners of semiconductor device 100B for illustration purposes only, but could be located within any region of the chip. These vias are also known as sense amp holes, and normally are used for routing control, addressing, I/O, power supply, or other electrical signals to the device 100B. However, in the present embodiment, thermal TSVs 140 are used for distributing and/or dissipating thermal energy away from device active region 120, and externally from device 100B through TSVs 140. As shown, the TSVs extend through device 100B to both a top surface 191 and a bottom surface 132. Top surface 191 of device 100B is also the top surface of the semiconductor element 110. Also, bottom surface 192 of device 100B is the bottom surface of the semiconductor element 130. In one embodiment, TSVs are filled with thermally conductive material. In another embodiment, TSVs are filled with CMOS compatible material. In still another embodiment, TSVs are filled with CMOS compatible material, and also lined with a barrier metal.

In still another embodiment, the TSVs are encircled with an insulating collar 145. In that manner, TSVs 140 are electrically and thermally isolated from elements 110 and 130, as well as from active components in the semiconductor device 120.

Figure 2:
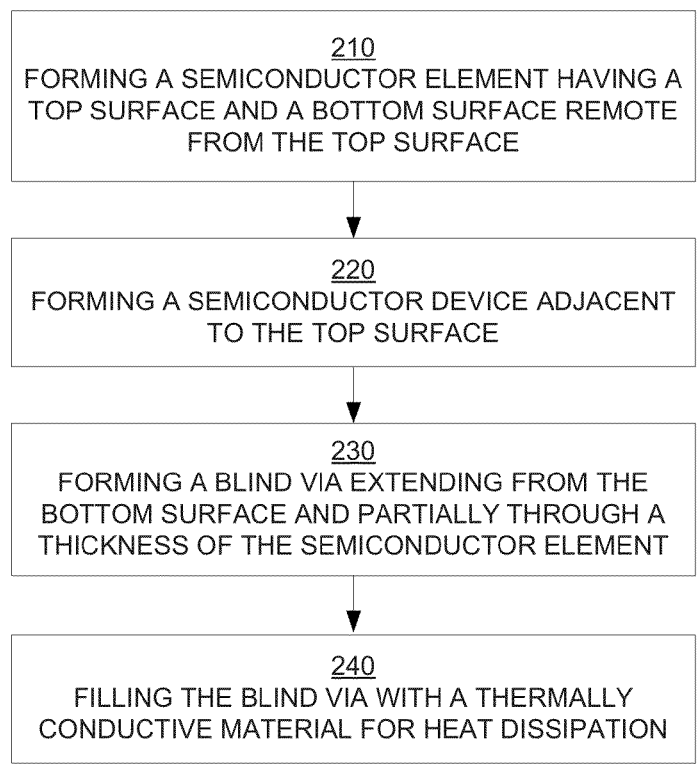
FIG. 2 is a flow chart of a method for performing thermal management in a microelectronic device having one or more blind vias for purposes of heat dissipation, in accordance with one embodiment of the present disclosure.

FIG. 2 is a flow chart of a method for performing thermal management in a microelectronic unit having one or more blind vias for purposes of heat dissipation, in accordance with one embodiment of the present disclosure. In particular, heat or thermal energy generated by active elements in the microelectronic unit is distributed and dissipated externally from a chip, as well as to the outside of a package including the microelectronic unit.

At 210, a semiconductor element is formed. For instance, the semiconductor element is a silicon substrate upon which other layers are disposed. The semiconductor element has first and second surfaces, in which the first surface is remote from the second surface.

At 220, a semiconductor device is disposed adjacent to the semiconductor element. For instance, the semiconductor device is formed adjacent to, on, or within the first surface. The semiconductor device includes active elements, such as, transistors. In one implementation, the semiconductor device is a memory array, such as, a DRAM or flash memory array. Thermal energy generated by the semiconductor device is dissipated using blind vias that are then thermally coupled to TSVs leading externally away from the semiconductor device.

In one embodiment, the semiconductor device is surrounded by insulating layers. For instance, the semiconductor element described above (e.g., a silicon substrate) lies below the semiconductor device. In addition, a dielectric element is disposed above the semiconductor device.

At 230, for thermal management, at least one blind via is formed within the semiconductor element, such as, the silicon substrate that is formed below the semiconductor device. In particular, the blind via extends from the second surface and partially into a thickness of the semiconductor element, and is filled with thermally conductive material at 240. The blind via does not contact the semiconductor device that is generating heat, and in that manner is electrically isolated from the device. However, thermal energy generated by the semiconductor device is distributed, transferred, dissipated, and/or conducted from the device to the adjacent semiconductor element, and then through the blind vias. As such, the blind vias act a conduit of the thermal energy, aid in the conduction of thermal energy away from the semiconductor device.

Electrically conductive material is disposed at the second surface and aligned and in contact with the at least one blind via that extends from the second surface and into the semiconductor element. In one embodiment, the electrically conductive material includes one or more solder balls that are disposed under the blind vias. In that manner, conduction of thermal energy continues through the blind vias and the electrically conductive materiel.

Figure 3A:
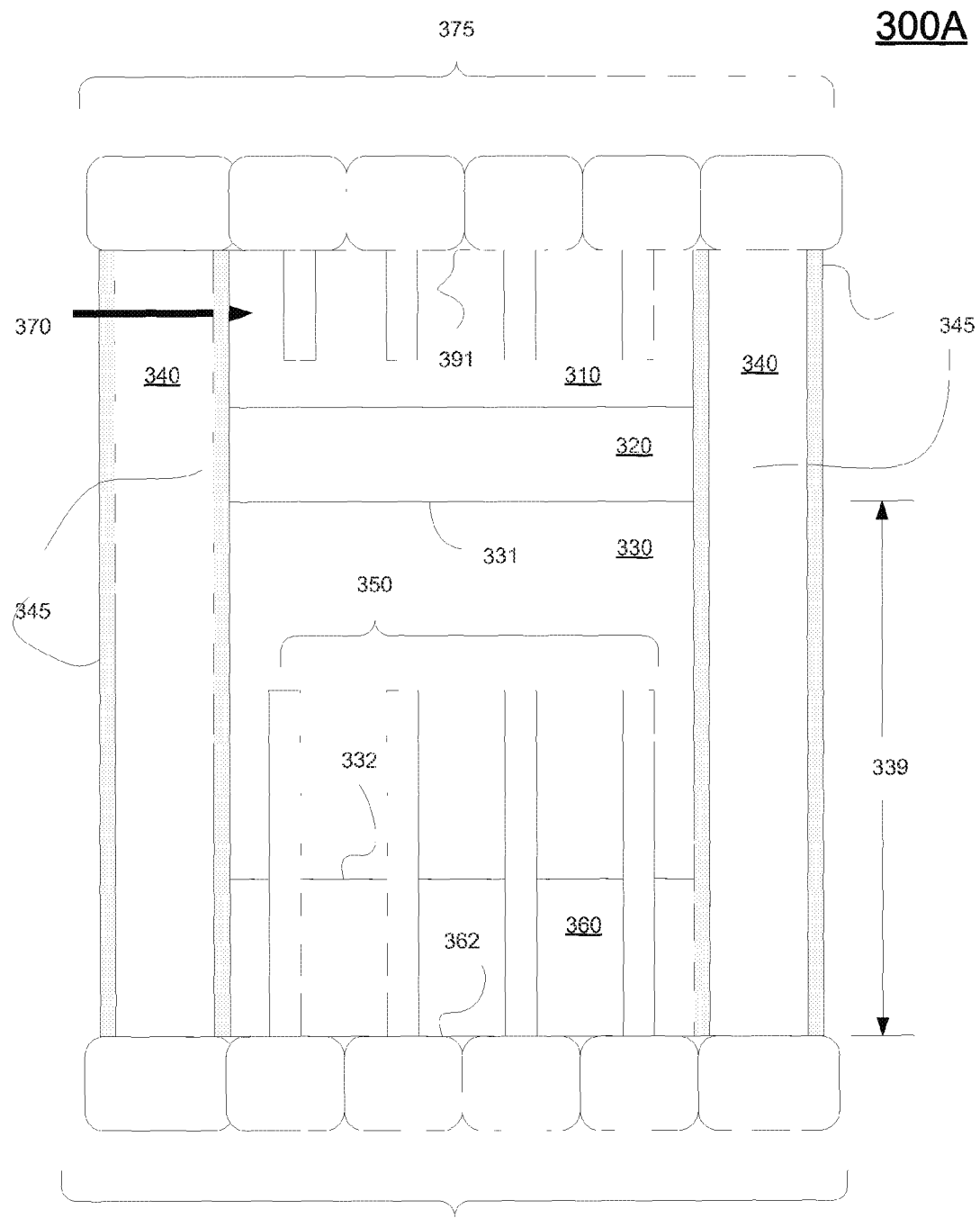
FIG. 3A is a cross-sectional view of a microelectronic device including two sets of blind vias used for purposes of heat dissipation, in accordance with one embodiment of the present disclosure.

FIG. 3A is a cross-sectional view of a microelectronic device 300A including two sets of blind vias used for purposes of heat dissipation, in accordance with one embodiment of the present disclosure. As such, heat or thermal energy generated by active elements in the microelectronic device is distributed, transferred, dissipated, and thermally conducted externally away from the device, and possibly to points external to a packaging that includes the microelectronic devices.

As shown in FIG. 3A, microelectronic device 300A includes semiconductor element 330 having a top surface 331 and bottom surface 332 remote from the top surface. Terms "top" and "bottom" are not intended to limit the structure of element 330, and can equally be referenced using terms such as "first" and "second." In one embodiment, element 330 is a silicon substrate to serve as a structure for disposing active components.

Semiconductor device 320 is disposed adjacent to, on, or within the top surface 331 of the semiconductor element 330. For illustration, the semiconductor device 320 could be any conventional semiconductor chip of varying functionality, such as, a memory array that includes a plurality of memory components of varying types. Device 320 generates heat or thermal energy through normal operation. This thermal energy generated by device 320 is further distributed, transferred and/or dissipated to adjacent and surrounding layers, such as, semiconductor element 330. As an example, silicon in the semiconductor element 330 has good thermal conductive qualities for passively receiving the transfer of thermal energy from device 320.

In some embodiments, another optional semiconductor element 360 is disposed below the semiconductor element 330 (e.g., silicon substrate). That is, the element 360 is disposed adjacent to the bottom surface 332 of element 330. More particularly, element 360 includes a rear surface 362 that is remote from the bottom surface 332 of element 330. In one implementation, semiconductor element 360 is an insulating (e.g., oxide) layer.

Further, one or more blind vias 350 are formed within the semiconductor elements 330 and 360 to actively and conductively distribute, transfer, and/or dissipate the heat generated by the semiconductor device 320. Formation of the blind vias 350 may be accomplished using any suitable fabrication techniques. The blind vias 350 extend from the rear surface 362 and fully through element 360, and partially into semiconductor element 330. More specifically, the blind vias 350 extend partially into a thickness 339 of the semiconductor element 330, and do not contact semiconductor device 320 including active components. In that manner, blind vias 350 are isolated from the active components in device 320.

In one embodiment, the blind vias 350 are filled with thermally conductive material for heat dissipation. Specifically, thermal energy collecting in element 330 is conducted through blind vias 350 away from semiconductor device 320, through element 320, and through element 360. Since element 360 is an insulator that does not conduct thermal energy well, blind vias 350 help to form a pathway to conduct the thermal energy away from device 320. In another embodiment, the material in blind vias 350 is also electrically conductive.

As shown in FIG. 3A, electrically conductive material 355 is placed in contact with the thermally conductive material filling the blind vias 350. The electrically conductive material 355 is also inherently thermally conductive. In this manner, heat energy collecting and stored in the blind vias 350 has a path leading externally away from the semiconductor device 320, and externally away from microelectronic device 300A. In one implementation, material 355 includes one or more solder balls. Further, in one embodiment, the spacing of the electrically conductive material 355 is configured such that adjacent electrically conductive material 355 are in contact to form a mesh structure. In that manner, thermal energy stored in the blind vias 350 have additional conductive pathways for dissipation.

In addition, device 300A includes a semiconductor element 310 that is a dielectric element. For instance, dielectric material may protect and electrically isolate active elements in the semiconductor device 320, and is disposed adjacent to device 320. Further, a second type of blind vias 370 is formed within the semiconductor element 310, extending from surface 391 and partially into element 310, such that contact is not made with the active components of semiconductor device 320 for purposes of electrical isolation. Thermally conductive material fills the blind vias 370. Additionally, electrically conductive material 375 is formed on surface 391 and aligned with the blind vias 370 for purposes of heat dissipation. In one embodiment, material 375 is configured in a mesh structure, and helps to distribute, transfer, dissipate and conduct thermal energy away from device 300A. Though dielectric material 310 is a poor thermal conductor, blind vias 370 may be aligned with another adjacent device such as device 300A to help with dissipation and transfer of heat from that device, as will be described below. For instance, adjacent chips similarly configured to device 300A are stacked such that a mesh structure formed from electrically conductive material 355 is formed between the semiconductor element 360 of the first device 300A and the semiconductor element 310 of the second device, wherein both deices are configured as device 300A.

Additionally, TSVs 340 are disposed adjacent to or within semiconductor elements 310, 330, and 360 as well as semiconductor device 320. As such, thermal TSVs 340 extend through the semiconductor device 300A from surface 391 to surface 362 and are used for purposes of thermally conducting heat energy externally away from the semiconductor device 320, and ultimately away from device 300A. For instance, the TSVs are filled with thermally conductive material, and electrically conductive material 375 is disposed on surface 391 and in alignment with TSVs 340 for heat dissipation. For instance, a thermally conductive path includes in part the blind vias 370, mesh structures 375, and TSVs 340.

Also another thermally conductive path includes in part the blind vias 350, mesh structures 355, and TSVs 340. Heat may be further distributed externally from microelectronic device 300A through leads or traces thermally coupling external elements to TSVs 340.

In one embodiment, TSVs 340 are further encircled with an insulating collar 345. In that manner, TSVs 340 are thermally and electrically isolated from semiconductor device 320, and elements 310 and 330. The ends of the TSVs 340 are exposed for thermal and electrical coupling. In another embodiment, TSVs 340 are not encircled with an insulating collar, and the TSVs are filled with complementary metal-oxide semiconductor (CMOS) compatible materials (e.g., tungsten, etc.). As such, thermal heat energy may dissipate directly from element 330 through adjacent TSVs 340.

Figure 3B:
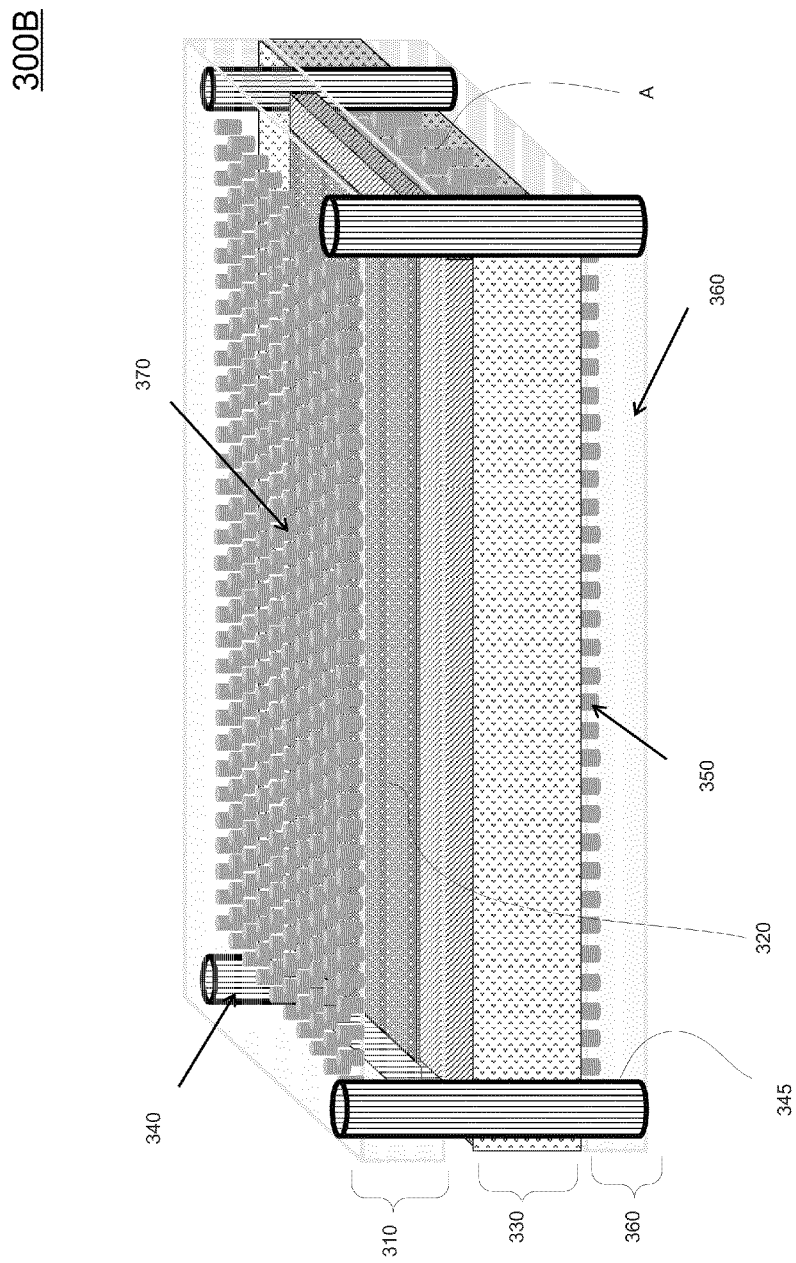
FIG. 3B is a perspective view of a microelectronic device including two sets of blind vias used for purposes of heat dissipation, in accordance with one embodiment of the present disclosure.

FIG. 3B a perspective view of a microelectronic device 300B illustrating one or more sets of blind vias used for purposes of heat dissipation, in accordance with one embodiment of the present disclosure. In one embodiment, FIG. 3B is a perspective view of the device 300A of FIG. 3A. For instance, device 300B includes an active region 320, and semiconductor elements 310, 330, and 360. For instance, active region 320 may include transistors and memory cells. In the case of a memory array in the active region 320, periphery devices may include row decoders and drivers, and sense amplifiers and column decoders, etc.

Also shown are first blind vias 350 disposed within elements 330 and 360, and specifically extending from a surface 362 of the element 360 and partially into a thickness of element 330, but not contacting active region 320. Section A shows blind vias 350 under the semiconductor device 320, and extending partially into semiconductor element 330. In addition, second blind vias 370 are disposed within element 310, and extend from surface 391 and partially into element 330, but do not contact active region 320.

TSVs 340 are shown at the corners of semiconductor device 300B for illustration purposes only, but could be located at any point of device 300B. These vias are also known as sense amp holes, and normally are used for routing control, addressing, I/O, power supply, or other electrical signals to the device 300B. However, in the present embodiment, thermal TSVs 340 are used for distributing and/or dissipating thermal energy away from device active region 320, and externally from device 300B through TSVs 340. As shown, the TSVs 340 extend through device 300B to both a top surface 391 and a bottom surface 362. In one embodiment, TSVs are filled with thermally conductive material. In another embodiment, TSVs are filled with CMOS compatible material. In still another embodiment, TSVs are filled with CMOS compatible material, and also lined with a barrier metal. In another embodiment, at least one TSV 340 is encircled with an insulating collar 345 for electrically and thermally isolating the TSVs 340 from active elements in semiconductor device 320, as well as semiconductor elements 310, 330, and 360.

FIG. 3C is a perspective view of a microelectronic unit 300C including two sets of blind vias for heat dissipation and solder balls 375 electrically connected to a second set of blind vias 320 disposed in a dielectric layer located adjacent to a top surface of a semiconductor device 320 for thermally conducting heat away from the microelectronic unit, in accordance with one embodiment of the present disclosure. Microelectronic unit 300C, in part, is similarly configured as microelectronic units 300A-B, such that like numbered elements are similarly used and configured in both structures and are fully disclosed in FIGS. 6A-B. As shown, a first set of blind vias 350 extends through semiconductor element 360 and partially into semiconductor element 330. A second set of blind vias 370 extends through semiconductor element 310 (e.g., dielectric layer). The solder balls 375 are configured in a ball grid array and are in contact with the second set of blind vias 370, and form a mesh structure designed to distribute, transfer, dissipate, and/or conduct thermal energy both from semiconductor device 320 of microelectronic unit 300C as well as another similarly configured unit (300A-E) that is stacked with unit 300C. As shown, the mesh structure formed from the solder balls 375 of the ball grid array is in contact with the TSVs 340. In that manner, a thermally conductive path includes in part the blind vias 370, mesh structures 375, and TSVs 340.

Figure 3D:
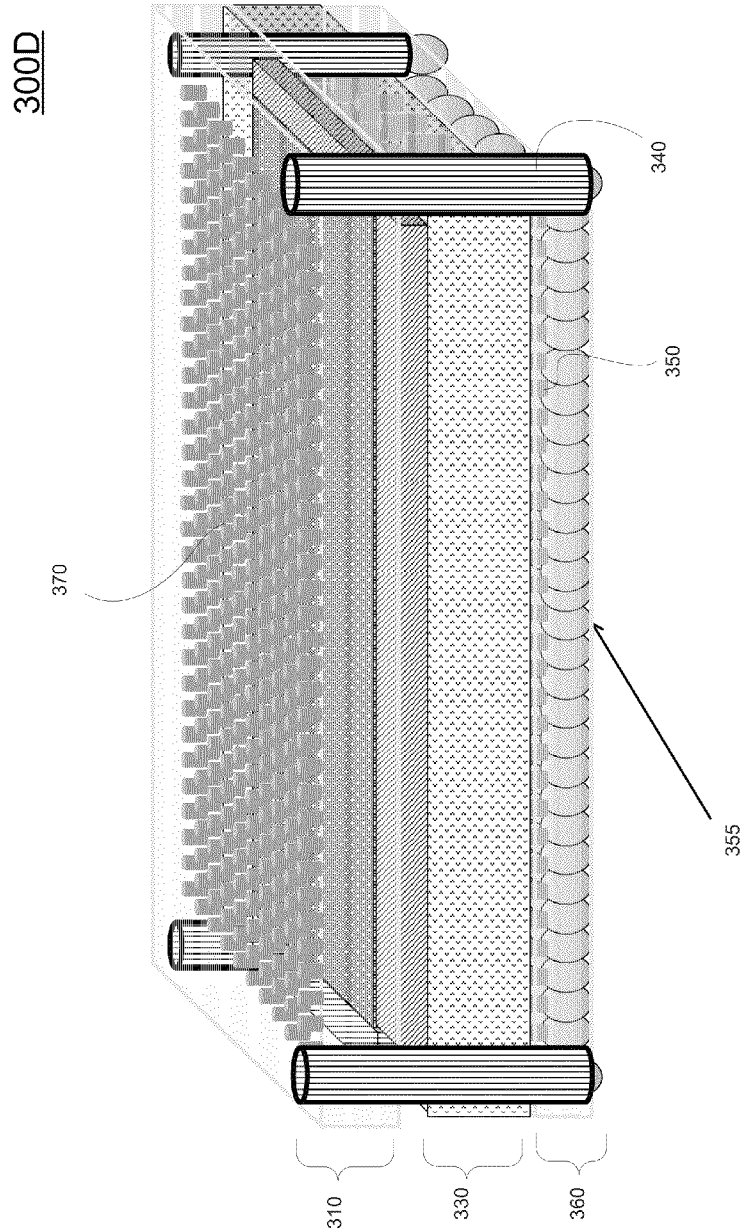
FIG. 3D is a perspective view of a microelectronic device including two sets of blind vias for heat dissipation and solder balls electrically connected to a first set of blind vias disposed in at least a substrate layer located adjacent to a bottom surface of a semiconductor device for thermally conducting heat away from the microelectronic unit, in accordance with one embodiment of the present disclosure.

FIG. 3D is a perspective view of a microelectronic unit 300D including two sets of blind vias for heat dissipation and solder balls 355 electrically connected to a first set of blind vias 350 disposed in at least a substrate layer located adjacent to a bottom surface of a semiconductor device 320 for thermally conducting heat away from the microelectronic unit 300D, in accordance with one embodiment of the present disclosure. As shown, a first set of blind vias 350 extends through semiconductor element 360 and partially into semiconductor element 330. A second set of blind vias 370 extends through semiconductor element 310 (e.g., dielectric layer). The solder balls 355 are configured in a ball grid array and are in contact with the first set of blind vias 350, and form a mesh structure designed to distribute, transfer, dissipate, and/or conduct thermal energy both from semiconductor device 320 of microelectronic unit 300D as well as another similarly configured unit (300A-E) that is stacked with unit 300D. As shown, the mesh structure formed from the solder balls 355 of the ball grid array are in contact with the TSVs 340. In that manner, a thermally conductive path includes in part the blind vias 350, mesh structures 355, and TSVs 340.

FIG. 3E is a perspective view of a microelectronic unit 300E including two sets of blind vias for heat dissipation and a redistribution layer (RDL) 380 electrically connected to a second set of blind vias 370 disposed in a dielectric layer 310 located adjacent to a top surface of a semiconductor device 320 for thermally conducting heat away from the microelectronic unit 300E, in accordance with one embodiment of the present disclosure. As shown, a second set of blind vias 370 extends through semiconductor element 310 (e.g., dielectric layer). The RDL 380 is disposed adjacent to and in contact with the second set of blind vias 370 on the surface of semiconductor element 310. The RDL 380 is configured to distribute, transfer, dissipate, and/or conduct thermal energy both from semiconductor device 320 of microelectronic unit 300E as well as another similarly configured units (300A-E) that is stacked with unit 300E. As shown, the mesh structure formed from the solder balls 355 of the ball grid array is in contact with the TSVs 340. In that manner, a thermally conductive path includes in part the blind vias 370, RDL 380, and TSVs 340.

Figure 4A:
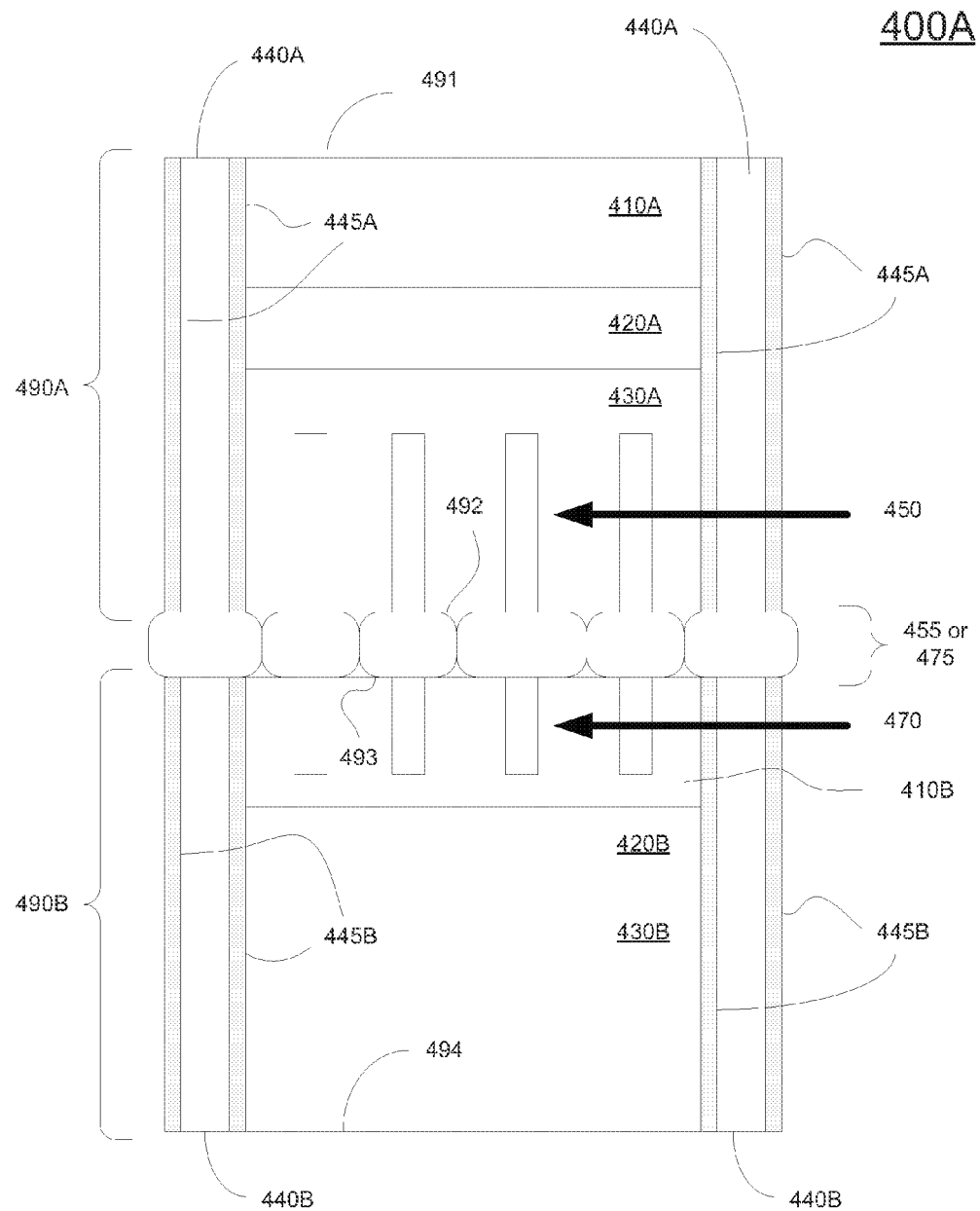
FIG. 4A is a cross-sectional view of two microelectronic devices stacked together in the same orientation such that a thermally conductive material such as, a solder ball is placed between a substrate of a first microelectronic unit and a dielectric element of a second microelectronic unit, each with blind vias used for purposes of heat dissipation, in accordance with one embodiment of the present disclosure.

FIG. 4A is a cross-sectional view of an assembly 400A including two microelectronic units stacked together in the same orientation such that a thermally conductive material such as, a solder ball is placed between a substrate of a first microelectronic unit 490A and a dielectric element of a second microelectronic unit 490B, each with blind vias used for purposes of heat dissipation, in accordance with one embodiment of the present disclosure. Thermal energy generated by active elements in semiconductor devices of both microelectronic units 490A and 490B are distributed, transferred, dissipated, and/or thermally conducted through corresponding blind vias, one or more mesh structures disposed between the units 490A and 490B, and out through respective TSVs 440A and/or 440B.

As shown, microelectronic unit 490A includes a semiconductor device 420A and semiconductor elements 410A and 430A. Microelectronic unit 490A is similarly configured as microelectronic unit 100A of FIG. 1A and/or microelectronic unit 300A of FIG. 3A, though not all features may be used or shown. For instance, unit 490A includes a first set of blind vias 450 that extends partially through semiconductor element 430A. TSVs 440A are disposed adjacent to or within semiconductor elements 410A and 430A, as well as semiconductor device 420A. An insulating collar 445A encircles TSV 440A, except for the ends at surfaces 491 and 492. As such, thermal TSVs 440A extend through microelectronic unit 490A from surface 491 to surface 492 and are used for purposes of thermally conducting heat energy externally away from the semiconductor device 420A, and ultimately away from device 490A. For instance, TSVs 440A are filled with thermally conductive material. Additionally, electrically conductive material 455 (e.g., solder ball grid array) is configured in a mesh structure designed to distribute, transfer, dissipate, and/or conduct thermal energy both from semiconductor device 420A of microelectronic unit 490A as well as from stacked unit 490B. As shown, the mesh structure is disposed in normally what would be a gap between the microelectronic units 490A and 490B.

As shown, microelectronic unit 490B includes a semiconductor device 420B and semiconductor elements 410B and 430B. Unit 490B is stacked below unit 490A, wherein both are oriented similarly. Microelectronic unit 490B is similarly configured as microelectronic unit 100A of FIG. 1A and/or microelectronic unit 300A of FIG. 3A though not all features may be used or shown. For instance, unit 490B includes a second set of blind vias 470 that extends partially through semiconductor element 410B (e.g., dielectric layer). TSVs 440B are disposed adjacent to or within semiconductor elements 410B and 430B, as well as semiconductor device 420B. An insulating collar 445B encircles TSV 440B, except for the ends at surfaces 493 and 494. As such, thermal TSVs 440B extend through microelectronic unit 490B from surface 493 to surface 494 and are used for purposes of thermally conducting heat energy externally away from the semiconductor device 420B, and ultimately away from device 490B. For instance, TSVs 440B are filled with thermally conductive material. Specifically, TSVs 440A and 440B are in contact with mesh structure 455 for purposes of dissipating heat from both units 490A and 490B. In that manner, a thermally conductive path includes in part the blind vias 470, mesh structure 455, and TSVs 445A-B. Also, another thermally conductive path includes in part the blind vias 450, mesh structure 455, and TSVs 445A-B.

Figure 4B:
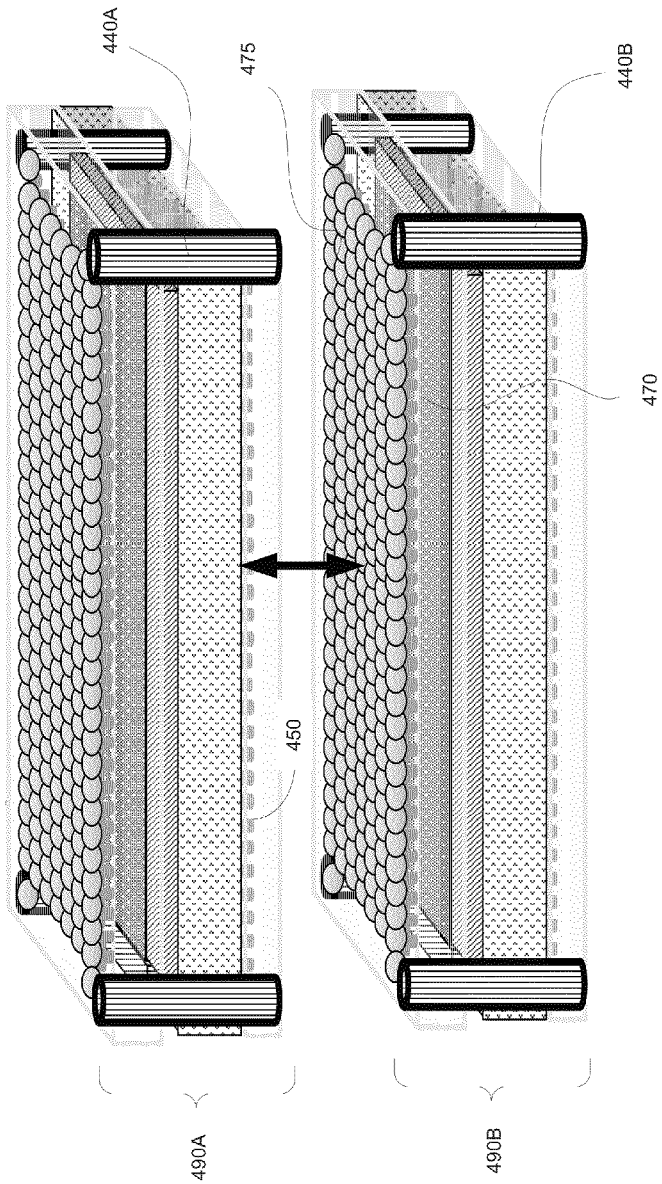
FIG. 4B is a perspective view of two microelectronic devices stacked together in the same orientation as shown in FIG. 4A, each with blind vias used for purposes of heat dissipation, in accordance with one embodiment of the present disclosure.

FIG. 4B is a perspective view of an assembly 400B including two microelectronic devices 490A and 490B stacked together in the same orientation as shown in FIG. 4A, each with blind vias used for purposes of conducting thermal energy externally from both units 490A and 490B using blind vias and TSVs, in accordance with one embodiment of the present disclosure. Specifically, microelectronic unit 490A is oriented similarly to microelectronic unit 490B when stacking the two together, as is shown in FIG. 4A. As such, the silicon substrate of semiconductor element 430A of unit 490A is disposed above the dielectric of semiconductor element 410B of unit 490B, with the mesh structure 455 disposed therebetween. As shown, the two units 490A and 490B are aligned such that TSVs 440A and 440B are in alignment, and furthermore, the mesh structure 455 disposed above and in contact with the second set of blind vias 470 in unit 490B are also aligned with, disposed below, and in contact with the first set of blind vias 450 in unit 490A.

Figure 5A:
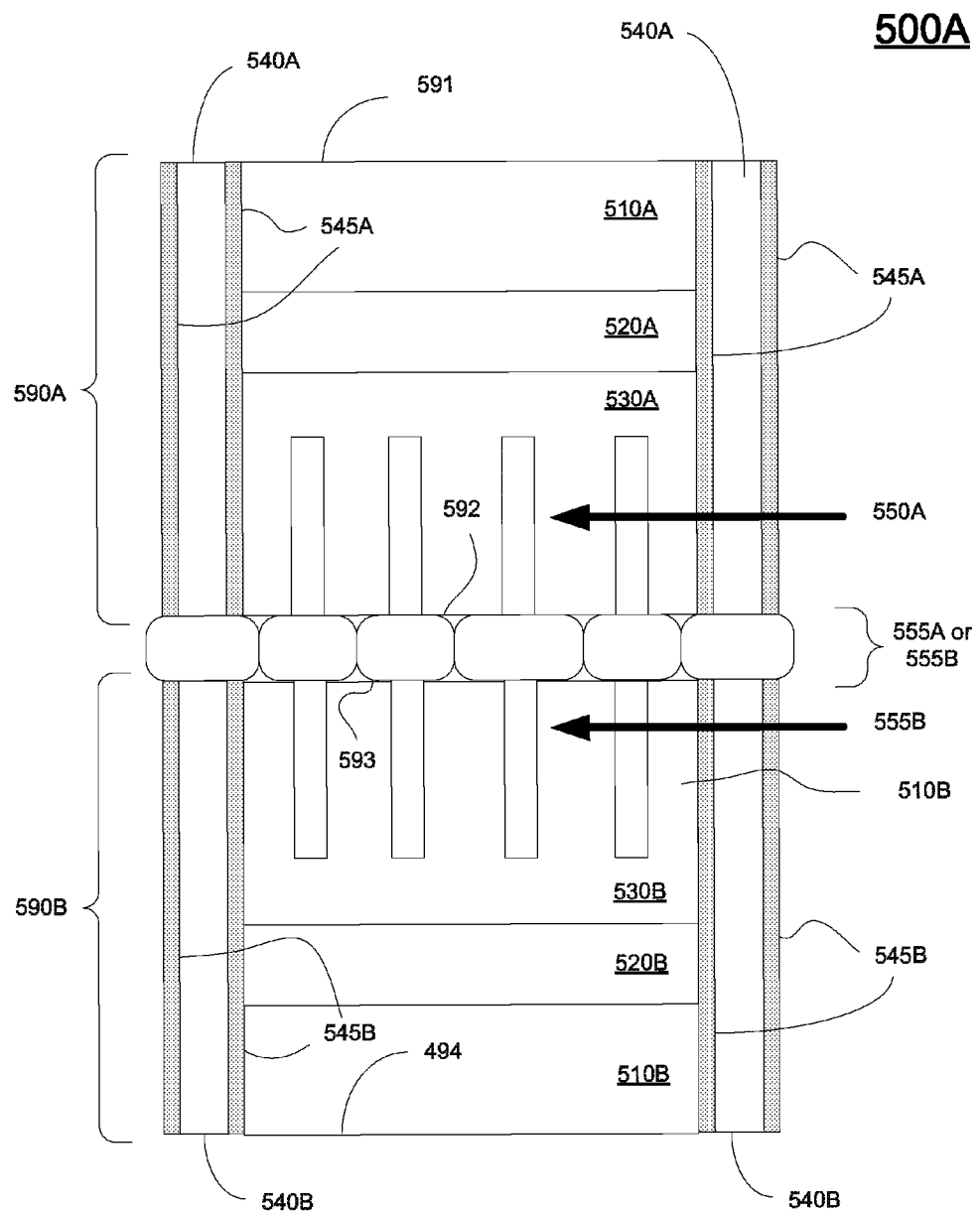
FIG. 5A is a cross-sectional view of two microelectronic devices stacked together in opposing orientations, wherein substrates of each microelectronic unit are facing each other with a thermally conductive material, such as, a wire mesh configuration comprising solder balls disposed therebetween, each microelectronic unit having blind vias used for purposes of heat dissipation, in accordance with one embodiment of the present disclosure.

FIG. 5A is a cross-sectional view of two microelectronic devices stacked together in opposite orientations, wherein substrates of each microelectronic unit are adjacent, each microelectronic unit having blind vias used for purposes of heat dissipation, in accordance with one embodiment of the present disclosure. Thermal energy generated by active elements in semiconductor devices of both microelectronic units 590A and 590B are distributed, transferred, dissipated, and/or thermally conducted through corresponding blind vias, one or more mesh structures disposed between the units 590A and 590B, and out through respective TSVs 540A and/or 540B.

As shown, microelectronic unit 590A includes a semiconductor device 520A and semiconductor elements 510A and 530A. Microelectronic unit 590A is similarly configured as microelectronic unit 100A of FIG. 1A and/or microelectronic unit 300A of FIG. 3A, though not all features may be used or shown. For instance, unit 590A includes a first set of blind vias 550A that extends partially through semiconductor element 530A (e.g., silicon substrate). TSVs 540A are disposed adjacent to, on, or within semiconductor elements 510A and 530A, as well as semiconductor device 520A. As such, thermal TSVs 540A extend through microelectronic unit 590A from surface 591 to surface 592 and are used for purposes of thermally conducting heat energy externally away from the semiconductor device 520A, and ultimately away from device 590A. in that manner, a thermally conductive path includes in part the blind vias 550A, mesh structure 555, and TSVs 540S. For instance, TSVs 540A are filled with thermally conductive material. Additionally, electrically conductive material (e.g., solder ball grid array) is configured in a mesh structure 555 designed to distribute, transfer, dissipate, and/or conduct thermal energy both from semiconductor device 520A of microelectronic unit 590A as well as from stacked unit 590B. As shown, the mesh structure is disposed in normally what would be a gap between the microelectronic units 590A and 590B.

As shown, microelectronic unit 590B includes a semiconductor device 520B and semiconductor elements 510B and 530B. Unit 590B is stacked with unit 590A in a opposing or reverse orientation, such that a thermally conductive material such as, a wire mesh structure 555A and/or 555B comprising solder balls is placed between semiconductor elements 530A and 530B. Microelectronic unit 590B is similarly configured as microelectronic unit 100A of FIG. 1A and/or microelectronic unit 300A of FIG. 3A, though not all features may be used or shown. For instance, unit 590B includes a first set of blind vias 550B that extends partially through semiconductor element 530B (e.g., silicon substrate). TSVs 540B are disposed adjacent to or within semiconductor elements 510B and 530B, as well as semiconductor device 520B. As such, thermal TSVs 540B extend through microelectronic unit 590B from surface 593 to surface 594 and are used for purposes of thermally conducting heat energy externally away from the semiconductor device 520B, and ultimately away from device 590B. For instance, TSVs 540B are filled with thermally conductive material and are thermally coupled to the electrically conductive material configured in a mesh structure 555. In that manner, a thermally conductive path includes in part the blind vias 540B, mesh structures 555, and TSVs 540.

Figure 5B:
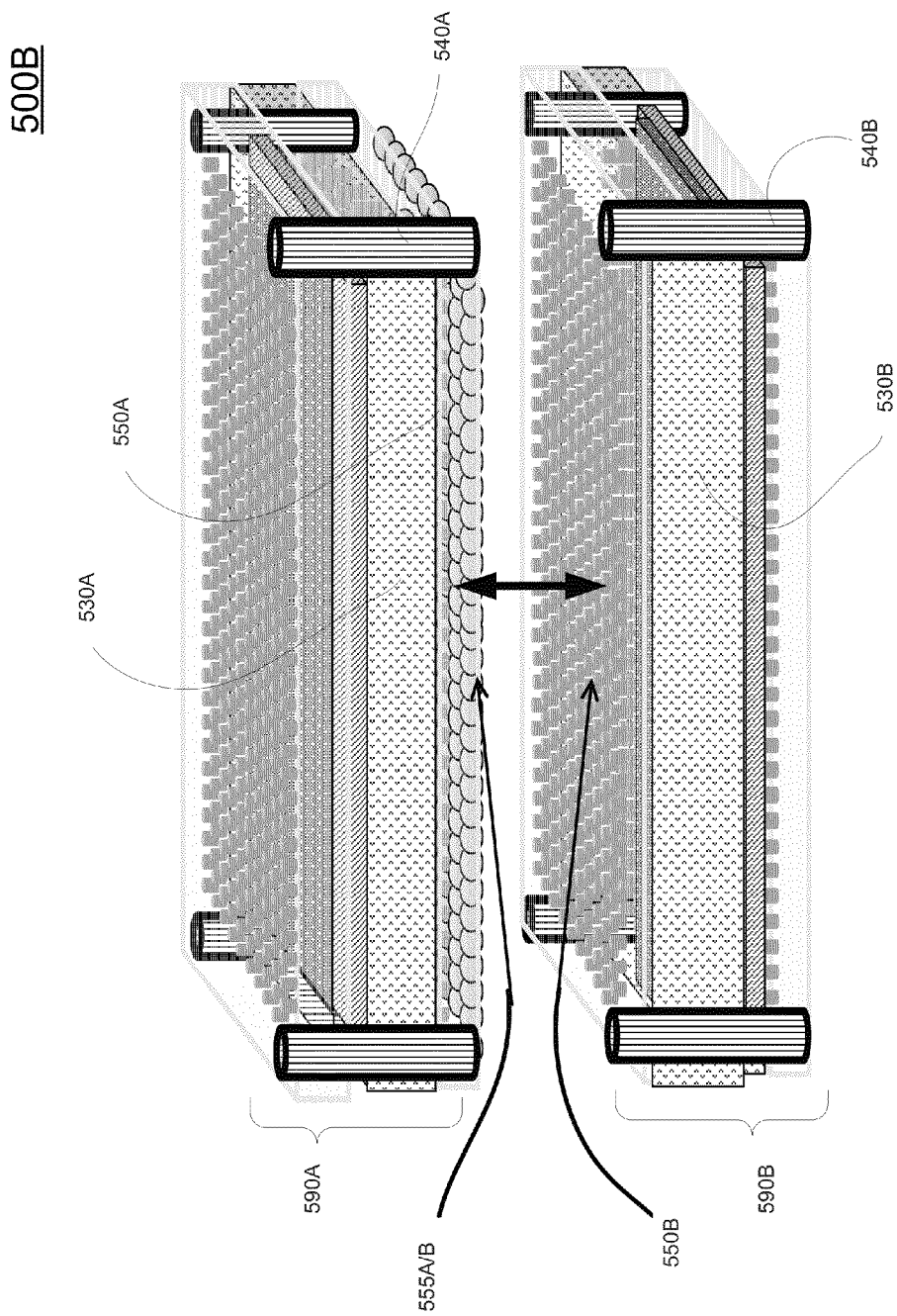
FIG. 5B is a perspective view of two microelectronic devices stacked together in opposing orientations as shown in FIG. 5A, each with blind vias used for purposes of heat dissipation, in accordance with one embodiment of the present disclosure.

FIG. 5B is a perspective view of two microelectronic devices 590A and 590B stacked together in opposing orientations as shown in FIG. 5A, each with blind vias used for purposes of conducting thermal energy externally from both units 590A and 590B using blind vias and TSVs, in accordance with one embodiment of the present disclosure. Specifically, the orientation of microelectronic unit 590A is opposite from the orientation of microelectronic unit 590B when stacking the two together, as is shown in FIG. 5A. As such, the silicon substrates of semiconductor element 530A of unit 590A is disposed above the silicon substrate of semiconductor element 530B of unit 590B, with the mesh structure 555 disposed therebetween. As shown, the two units 590A and 590B are aligned such that TSVs 540A and 540B are in alignment, and further, that the mesh structure 555 disposed below and in contact with the first set of blind vias 550A in unit 590A are also aligned with, disposed above, and in contact with the first set of blind vias 550B in unit 590A.

Figure 6A:
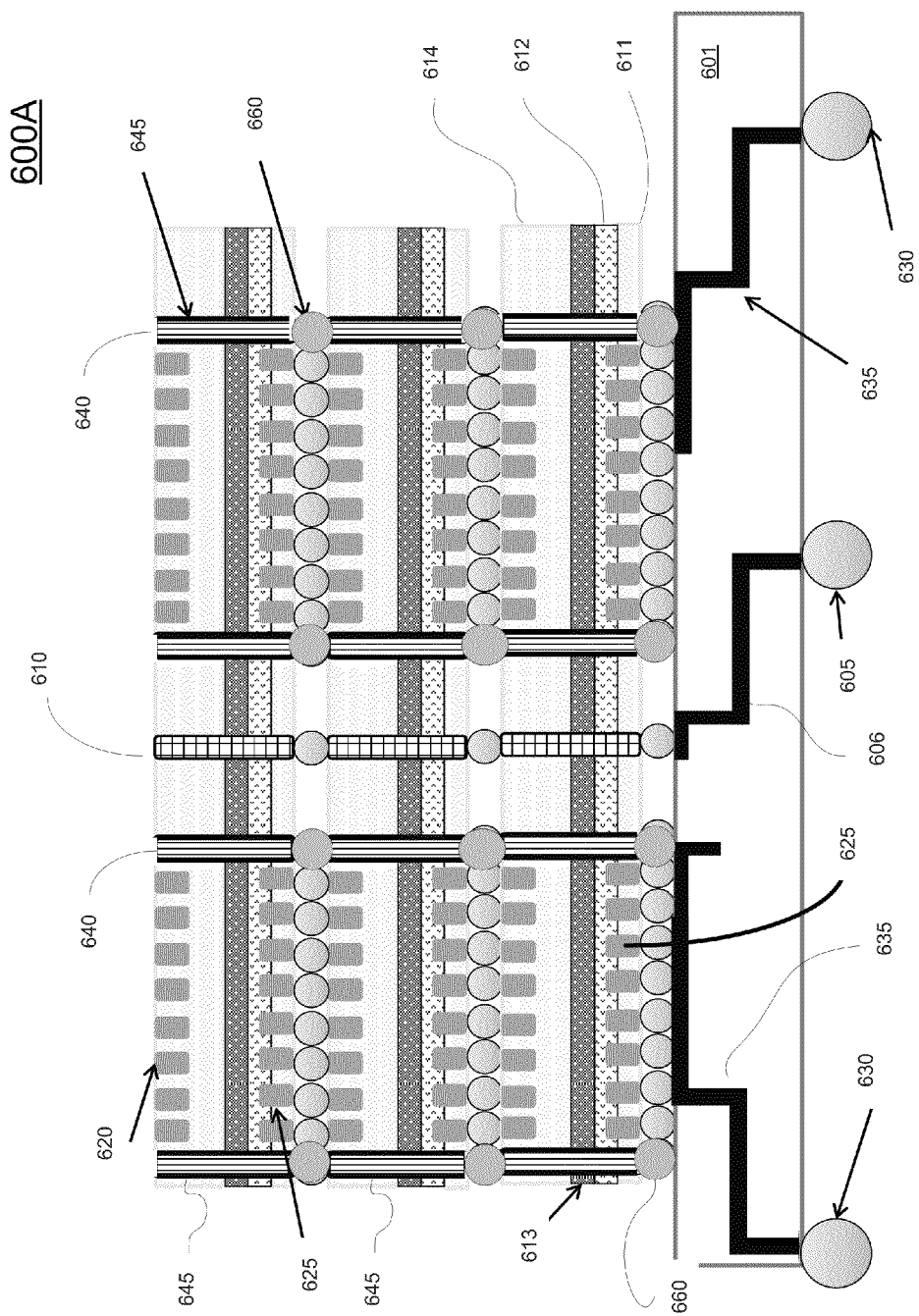
FIG. 6A is a cross-sectional view of a triple stacked microelectronic device structure mounted on a substrate illustrating two sets of blind vias for each microelectronic unit that are used for heat dissipation and solder balls connecting the blind vias to TSVs having insulating collars for external dissipation of the heat, in accordance with one embodiment of the present disclosure.

FIG. 6A is a cross-sectional view of a triple stacked microelectronic device structure 600A mounted on a substrate 601 illustrating two sets of blind vias 620 and 625 for each microelectronic unit that is used for heat dissipation, and solder balls connecting blind vias to TSVs 640, having insulating collars 645, for external dissipation of the heat, in accordance with one embodiment of the present disclosure. Structure 600A may be included in a multi-chip packaged device. Although structure 600A includes three layers, embodiments of the present invention are well suited to supporting structures of varying number of layers. As shown in FIG. 6A, each of the microelectronic units is oriented similarly, as in FIG. 4A, but easily could be configured such that units in a pair are of opposite orientation, as in FIG. 5A. As shown, a representative microelectronic unit includes a semiconductor device 613 and semiconductor elements 611 (e.g., insulator)(optional), 612 (e.g., silicon substrate), and 614, another insulator and/or dielectric layer (e.g., oxide). Each of the stacked microelectronic units is similarly configured. The representative microelectronic unit is similarly configured as microelectronic unit 100A of FIG. 1A and/or microelectronic unit 300A of FIG. 3A, though not all features may be used or shown. For instance, the unit includes a first set of blind vias 625 that extends partially through the semiconductor element 612 (e.g., silicon substrate) and through insulator layer 611. Also, the representative unit includes a second set of blind vias 620 that extends partially through the semiconductor element 614 (e.g., dielectric layer). TSVs 640 with insulating collars 645 are disposed adjacent to or within the microelectronic units. In another embodiment, TSVs 640 do not have insulating collars, as will be further shown in FIG. 6B. Moreover, TSVs 640 are shown at various points within the plane of the die structure forming the microelectronic unit.

As shown in FIG. 6A, solder balls 660 are disposed in alignment with the first and second set of blind vias 620 and 625 of opposing microelectronic units for heat dissipation. Further, conventional TSVs 610 used for control, addressing, I/O, power supply, or other electrical signals are formed and interconnected with other elements through interconnect 660 and terminal 605. Additionally, the mesh structures formed with the solder balls 660 are thermally coupled to interconnects 635 and point to package terminals 630 that lead externally from the package containing the triple stacked structure 600A.

Figure 6B:
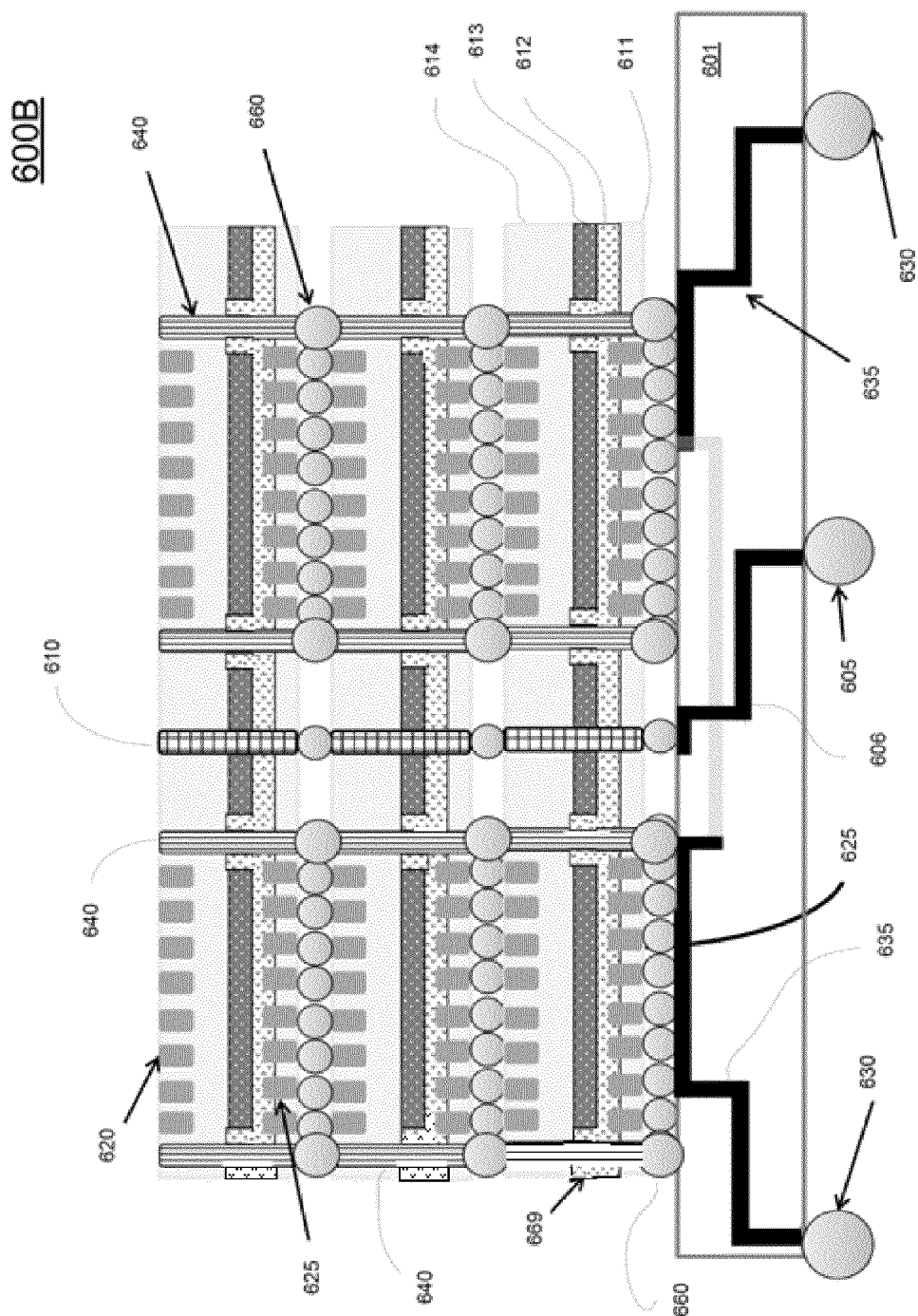
FIG. 6B is a cross-sectional view of a triple stacked microelectronic device structure mounted on a substrate illustrating two sets of blind vias for each microelectronic unit that are used for heat dissipation and solder balls connecting the blind vias to exposed TSVs for external dissipation of the heat, in accordance with one embodiment of the present disclosure.
Figure 6C:
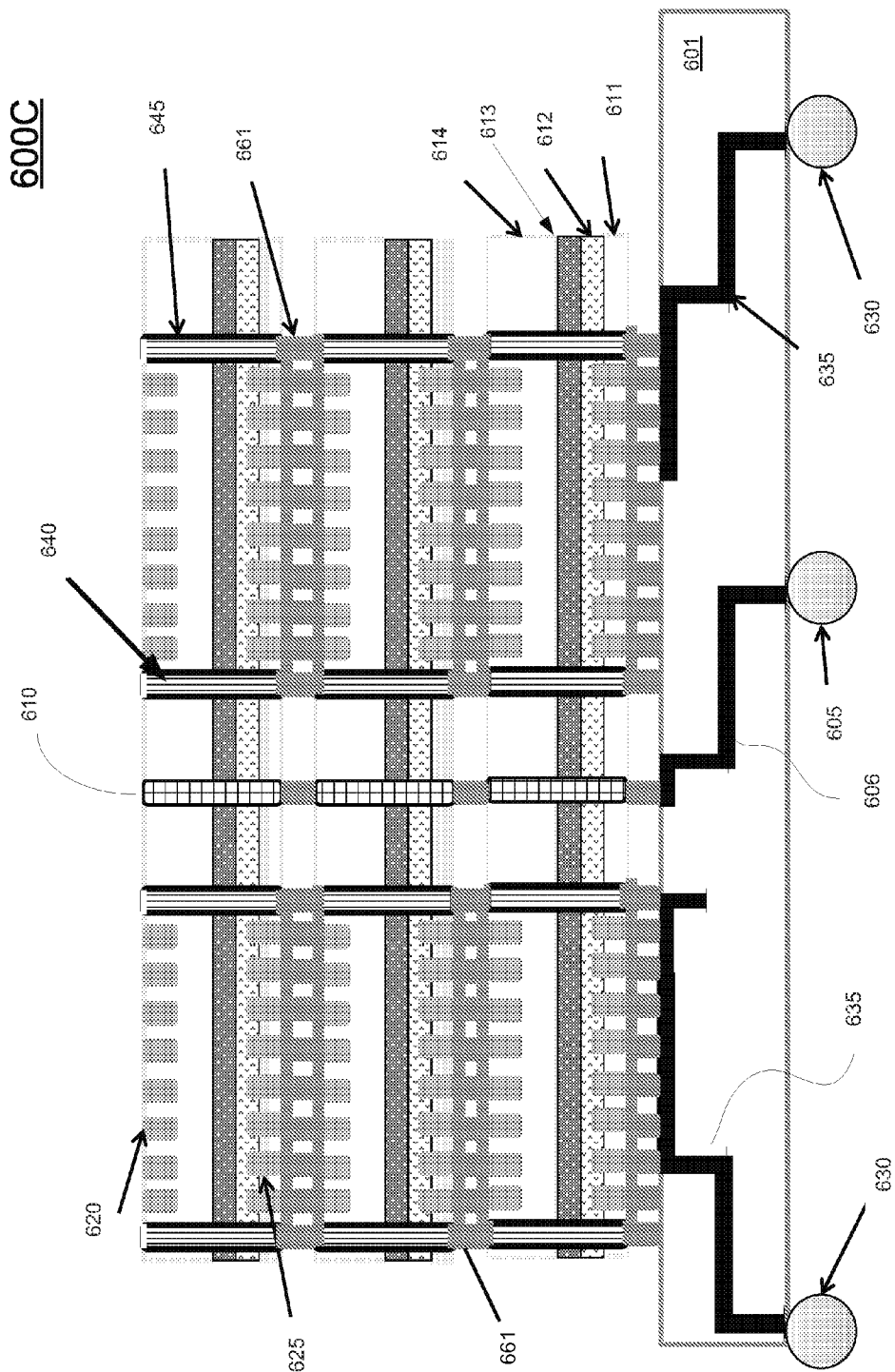
FIG. 6C is a cross-sectional view of a triple stacked microelectronic device structure mounted on a substrate illustrating two sets of blind vias for each microelectronic unit that are used for heat dissipation and copper pillars connecting to the blind vias for external dissipation/distribution of the heat, in accordance with one embodiment of the present disclosure.

FIG. 6B is a cross-sectional view of a triple stacked microelectronic device structure 600B mounted on a substrate 601 that is similar in configuration to structure 600A of FIG. 6A. The discussion in FIG. 6A regarding similarly numbered elements is equally applicable in the assembly shown in FIG. 6B. For instance, each microelectronic unit has two sets of blind vias 620 and 625. As shown, solder balls 660 are disposed in alignment with the blind vias, and connect blind vias to TSVs 640, for external dissipation of the heat. However, the TSVs 640, filled with electrically conductive material, are exposed to the semiconductor elements and devices, as no insulating collar is used to electrically isolate the TSVs. As such, the TSVs are able to conduct thermal energy from each of the elements, layers, and devices (e.g., 611-614) in the microelectronic unit. Since the TSVs 640 are in direct contact with the semiconductor device layer 613, the TSVs 640, filled with electrically conductive material, are electrically isolated from the components at that level, by an oxide ring 669 encircling a corresponding TSV. In that manner, active components in the semiconductor device 612 are separated and electrically isolated from the TSVs 640. Since the TSVs 640 are in direct electrical contact with the semiconductor substrate, they should be spaced from active and passive devices including transistors, resistors, capacitors, and well regions in the semiconductor device layer. Furthermore, they should be either electrically floating or tied to a voltage potential consistent with the desired potential of the semiconductor substrate. Devices in the semiconductor device layer must be spaced apart from the TSVs in accordance with standard design rules. These devices are electrically isolated from TSVs and the substrate by standard isolation methods including shallow trench isolation or thermally grown oxides FIG. 6C is a cross-sectional view of a triple stacked microelectronic device structure 600C mounted on a substrate 601 illustrating two sets of blind vias for each microelectronic unit that is used for heat dissipation, and solder balls connecting blind vias to TSVs for external dissipation of the heat, in accordance with one embodiment of the present disclosure. Structure 600C may be included in a multi-chip packaged device. Microelectronic units in structure 600C are similarly configured as microelectronic units in structure 600A, such that like numbered elements are similarly used and configured in both structures and are fully disclosed in FIG. 6A. Unique to the present embodiment as shown in FIG. 6C, copper pillars 661 are disposed in alignment with the first and second set of blind vias of opposing microelectronic units for heat dissipation. The copper pillars 661 are also disposed in alignment with the TSVs 640, such that a thermal conduction path is established at least in part between the thermal conductive material filling the TSVs 640 and the pillar structure. Because the TSVs 640 have adjoining insulating collars 645, care is taken to properly align the copper pillars 661 to the TSVs 640. In addition, copper layers or traces may be disposed below, above, and in alignment with respective blind vias exposed through surfaces in the microelectronic unit. The copper pillars or posts provide another form of a standoff between the stacked die and/or microelectronic units. In that manner, a thermal conduction path is established at least in part between the blind vias, the pillar structure, and the TSVs 640 to distribute, transfer, dissipate, and/or conduct thermal energy away from layers in the microelectronic unit.

Figure 6D:
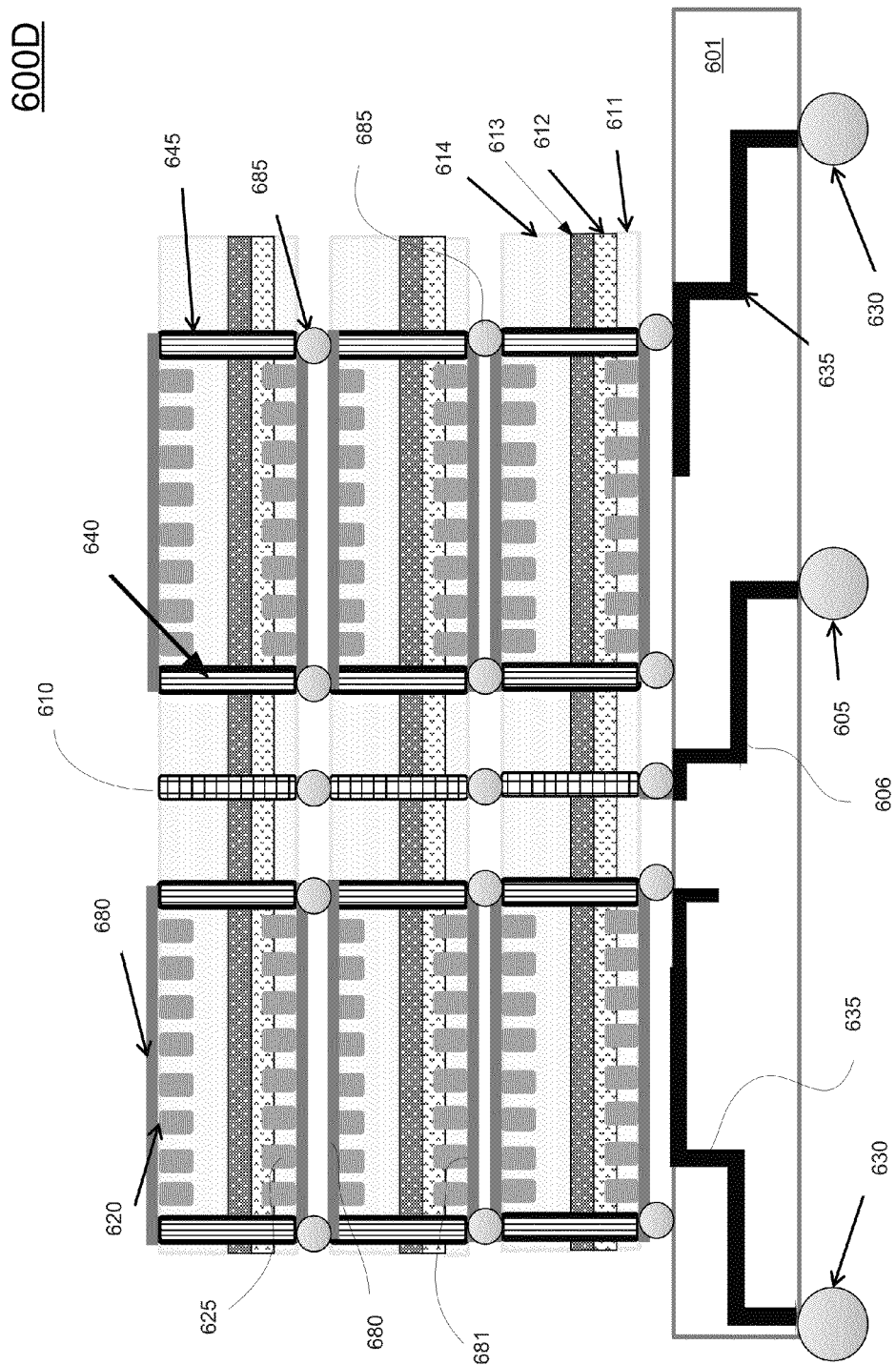
FIG. 6D is a cross-sectional view of a triple stacked microelectronic device structure mounted on a substrate illustrating two sets of blind vias for each microelectronic unit that are used for heat dissipation and redistribution layers connecting to the blind vias for external dissipation/distribution of the heat, in accordance with one embodiment of the present disclosure.

FIG. 6D is a cross-sectional view of a triple stacked microelectronic device structure 600D mounted on a substrate 601 illustrating two sets of blind vias for each microelectronic unit that is used for heat dissipation and redistribution layers connecting to the blind vias for external dissipation/distribution of the heat, in accordance with one embodiment of the present disclosure. Structure 600D may be included in a multi-chip packaged device. Microelectronic units in structure 600D are similarly configured as microelectronic units in structures 600A and 600B such that like numbered elements are similarly configured and used in all structures and are fully disclosed in FIG. 6A-B. Unique to the present embodiment as shown in FIG. 6D, RDL 680 disposed above a second set of blind vias located within a dielectric layer 614, and RDL 681 disposed below a first set of blind vias and extending partially through substrate 612 and through insulator 611 are used to distribute, transfer, dissipate, and/or thermally conduct thermal energy away from the individual microelectronic units and externally from the package including structure 600D. Solder balls 685 are disposed in alignment with TSVs 640 and with the RDLs 680 and 681 for heat dissipation. Because the TSVs 640 have adjoining insulating collars 645, care is taken to properly align the solder balls 685 to the thermally conductive material in TSVs 640. In this manner, a thermal conduction path is established at least on part between the first and second set of blind vias, the RDL structures 680 and 681, and the TSVs 640 to distribute, transfer, dissipate and/or conduct thermal energy away from layers in respective microelectronic units.

Figure 6E:
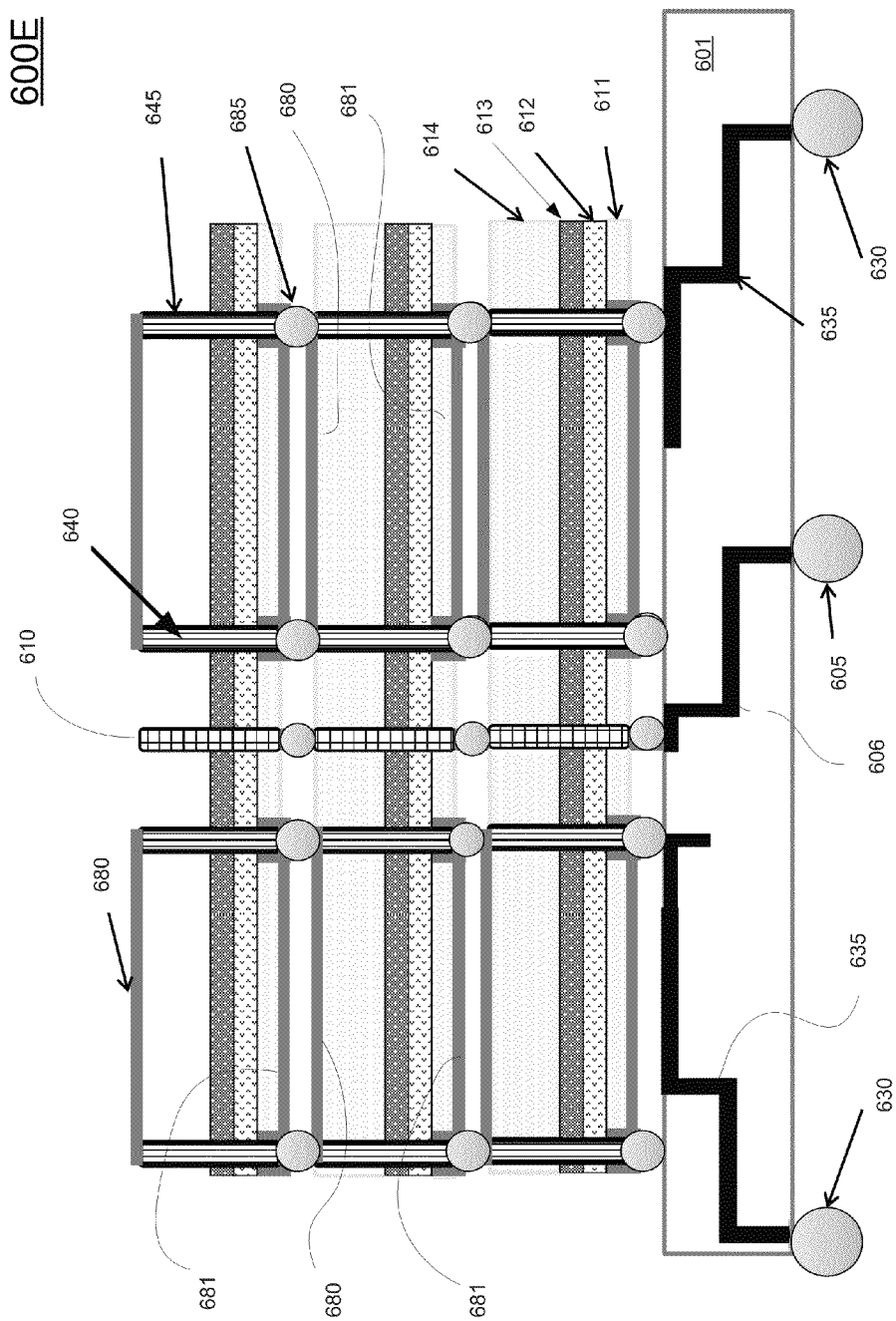
FIG. 6E is a cross-sectional view of a triple stacked microelectronic device structure mounted on a substrate illustrating two sets of blind vias for each microelectronic unit that are used for heat dissipation and metallic structures wrapped around the feet of TSVs having insulating collars and extending towards the silicon substrate for external dissipation of heat, in accordance with one embodiment of the present disclosure.

FIG. 6E is a cross-sectional view of a triple stacked microelectronic device structure 600E mounted on a substrate 601 which uses RDLs coupled to TSVs 640 for external dissipation/distribution of the heat, in accordance with one embodiment of the present disclosure. Structure 600D may be included in a multi-chip packaged device. Microelectronic units in structure 600D, in part, are similarly configured as microelectronic units in structures 600A-C and like numbered elements are similarly configured and used in all structures and are fully disclosed in FIGS. 6A-D. Unique to the present embodiment as shown in FIG. 6E are RDL 680 disposed above dielectric layer 614 that is subsequently removed, and RDL 681 disposed below insulator 611. Also, collars of thermally conductive material wrap around the base of one or more TSVs 640 to extend through the insulator 611 and come into contact with the substrate 612 for purposes of conducting thermal energy away from the active elements and from the substrate 612. RDLs 681 in contact with the substrate 612 are used to distribute, transfer, dissipate, and/or thermally conduct thermal energy away from the individual microelectronic units and externally from the package including structure 600D. RDLs 680 are used for structural support as well as for heat conduction. Solder balls or copper pillars 685 are disposed in alignment with TSVs 640 and with the RDLs 680 and 681 for heat dissipation. Because the TSVs 640 have adjoining insulating collars 645, care is taken to properly align the solder balls 685 to the thermally conductive material in TSVs 640. In this manner, a thermal conduction path is established at least on part between the first and second set of blind vias, the RDL structures 680 and 681, and the TSVs 640 to distribute, transfer, dissipate and/or conduct thermal energy away from layers in respective microelectronic units, and ultimately leading externally from a packaged device including structure 600E.

Figure 6F:
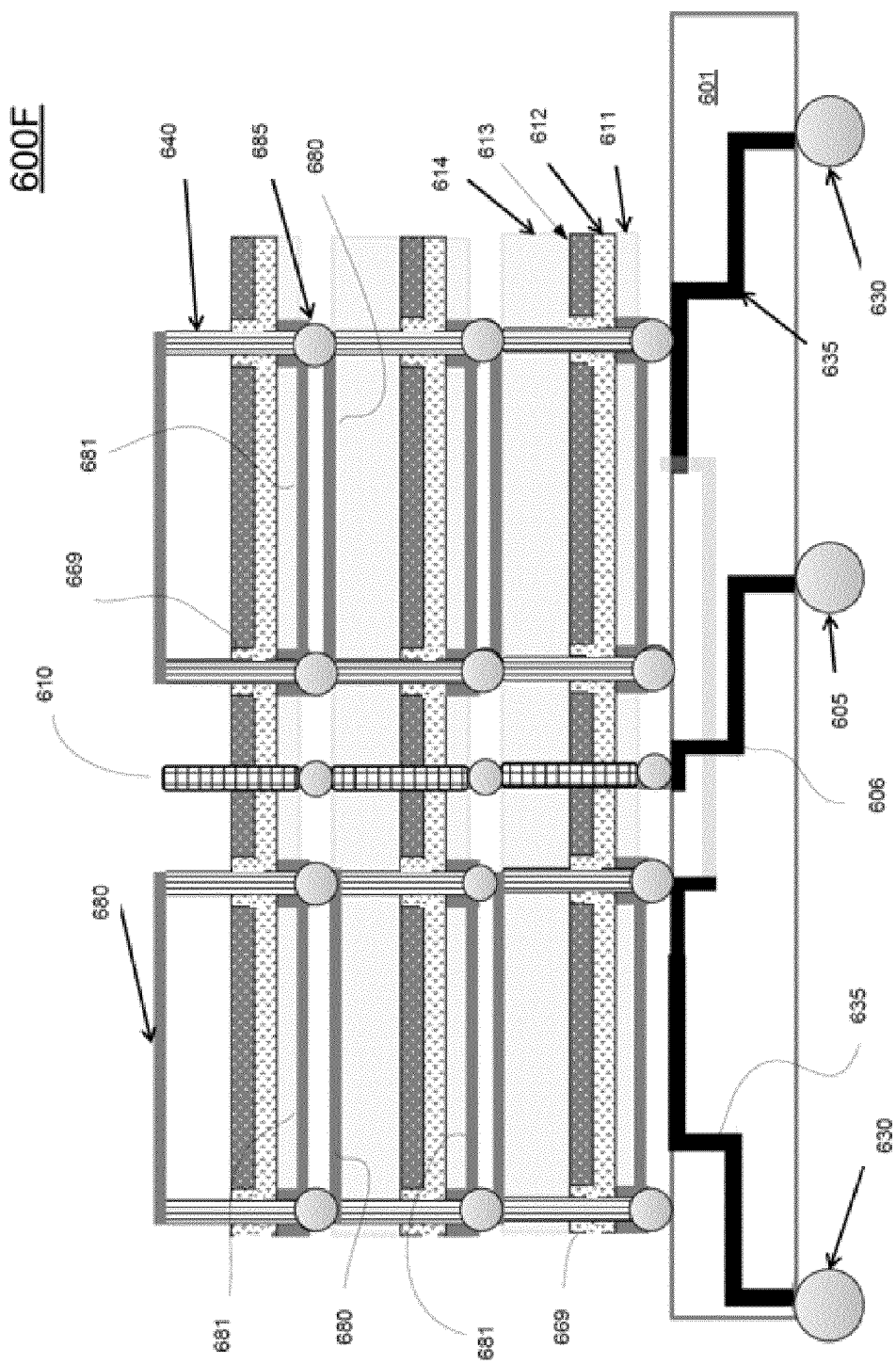
FIG. 6F is a cross-sectional view of a triple stacked microelectronic device structure mounted on a substrate illustrating two sets of blind vias for each microelectronic unit that are used for heat dissipation and metallic structures wrapped around the feet of exposed TSVs and extending towards the silicon substrate for external dissipation of heat, in accordance with one embodiment of the present disclosure.

FIG. 6F is a cross-sectional view of a triple stacked microelectronic device structure 600F mounted on a substrate 601 that is similar in configuration to structure 600E of FIG. 6E. The discussion in FIG. 6E regarding similarly numbered elements is equally applicable in the assembly 600F shown in FIG. 6F. For instance, each microelectronic unit has RDLs 680 and 681. As shown, solder balls 685 are disposed in alignment with the RDLs 680 and 681, as well as to TSVs 640, for external dissipation of the heat. However, the TSVs 640, filled with electrically conductive material, are exposed to the semiconductor elements and devices, as no insulating collar is used to electrically isolate the TSVs. As such, the TSVs are able to conduct thermal energy from each of the elements, layers, and devices (e.g., 611-614) in the microelectronic unit. Since the TSVs 640 are in direct contact with the semiconductor device layer 613, the TSVs 640, filled with electrically conductive material, are electrically isolated from the components at that level, by an oxide ring 669 encircling a corresponding TSV. In that manner, active components in the semiconductor device 612 are separated and electrically isolated from the TSVs 640. Since the TSVs 640 are in direct electrical contact with the semiconductor substrate, they should be spaced from active and passive devices including transistors, resistors, capacitors, and well regions in the semiconductor device layer. Furthermore, they should be either electrically floating or tied to a voltage potential consistent with the desired potential of the semiconductor substrate. Devices in the semiconductor device layer must be spaced apart from the TSVs in accordance with standard design rules. These devices are electrically isolated from TSVs and the substrate by standard isolation methods including shallow trench isolation or thermally grown oxides.

Figure 7:
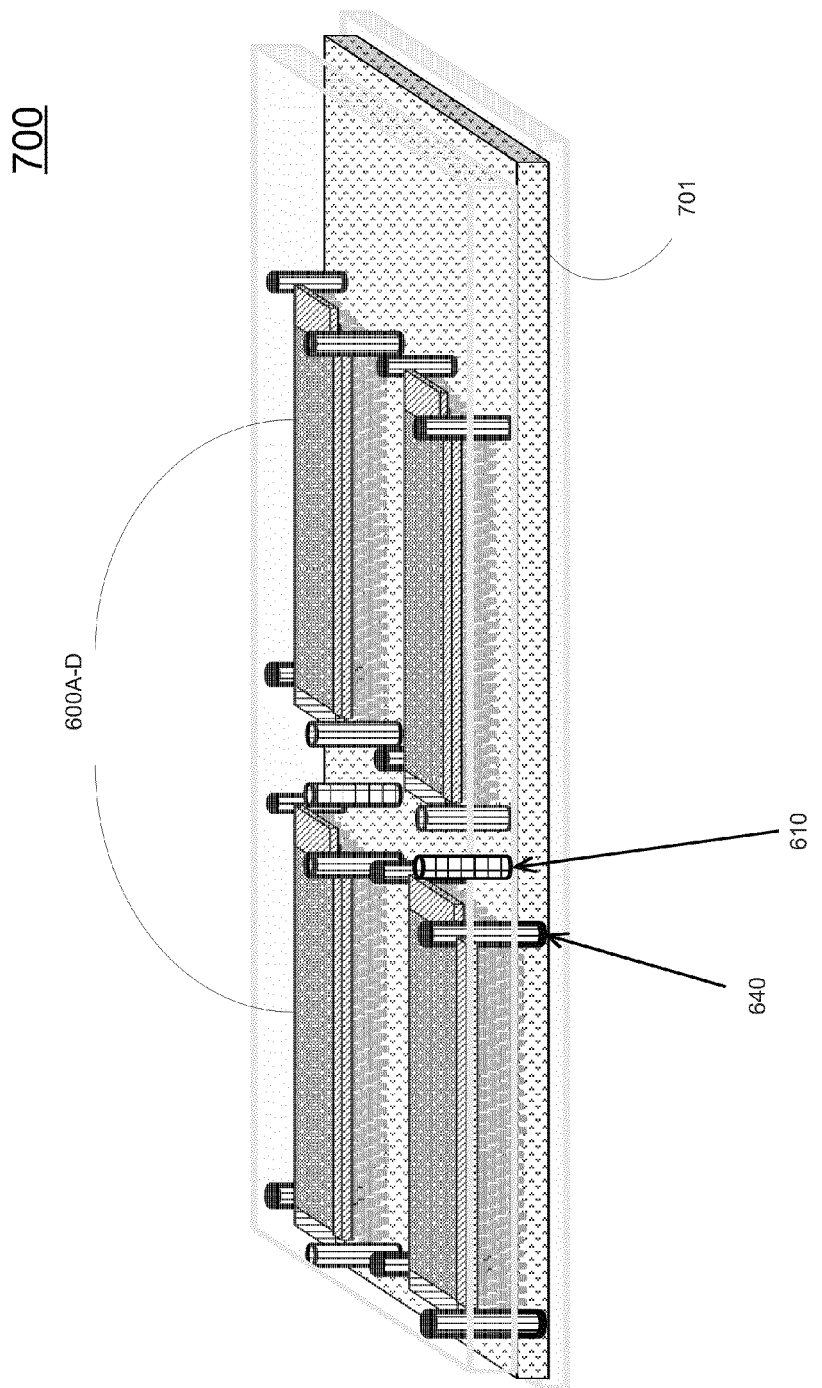
FIG. 7 is a perspective view of a microelectronic device structure mounted on a substrate including multiple memory arrays illustrating multiple thermal TSVs used for heat dissipation from each of the multi-chip stacked structures in the array and interconnect TSVs used for control, addressing, I/O, power supply, or other electrical signals, in accordance with one embodiment of the present disclosure.

FIG. 7 is a perspective view of a microelectronic device structure 700 mounted on a substrate 701. For instance, structure 700 includes multiple memory arrays arranged in triple stacked structures similar to structures 600A-D. Additionally, structure 700 includes multiple thermal TSVs 640 used for heat dissipation from each of the multi-chip stacked structures (e.g., 600A-D) in the array and interconnect TSVs 610 used for control, addressing, I/O, power supply, or other electrical signals, in accordance with one embodiment of the present disclosure. In particular, the structure 700 shown in FIG. 7 includes sixteen thermal TSVs 640 situated about four triple stacked structures (e.g., 600A-D). Though the stacks include structures with three layers, the structures may include any number of layers. In this manner, thermal energy generated by active elements in any of the structures (e.g., 600A-D) are distributed, transferred, dissipated, and/or thermally conducted away from the triple stacked structures (e.g., 600A-D). The thermal energy ultimately is conducted externally away from the packaged device including the structure 600A-D through contacts, traces, and/or leads connected to external elements.

Thus, according to embodiments of the present disclosure, devices and methods for performing management of thermal energy generated by the active components of a chip using blind vias within the chip, and for performing thermal management of various chips in a multi-chip stacked structure, also using blind vias formed within each of the semiconductor chips are disclosed.

While the foregoing disclosure sets forth various embodiments using specific block diagrams, flow charts, and examples, each block diagram component, flow chart step, operation, and/or component described and/or illustrated herein may be implemented, individually and/or collectively. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed:

1. A microelectronic unit, comprising:
a semiconductor element having a top surface and a bottom surface remote from said top surface;
a semiconductor device adjacent to said top surface;
one or more first blind vias extending from said bottom surface and partially into a thickness of said semiconductor element;
a thermally conductive material filling said one or more first blind vias for heat dissipation
electrically conductive material placed in contact with said thermally conductive material, wherein said thermally conductive material is also electrically conductive, and wherein said electrically conductive material is configured such that adjacent portions of electrically conductive material are interconnected in a mesh structure;
a second semiconductor element having a second top surface and a second bottom surface remote from said second top surface;
a second semiconductor device adjacent to said top surface;
one or more second blind vias extending from said second bottom surface and partially into a thickness of said second semiconductor element;
second thermally conductive material filling each of said one or more second blind vias for heat dissipation; and
second electrically conductive material connected to said second thermally conductive material, wherein said semiconductor device and said second semiconductor device are stacked in opposing orientation such that that said electrically conductive material and said second electrically conductive material are in contact with the mesh structure.

2. The microelectronic unit of claim 1, further comprising:
an insulating layer adjacent to said bottom surface, said insulating layer having a rear surface remote from said bottom surface, wherein each of said one or more first blind vias extends from said rear surface and through the insulating layer and into said semiconductor element.

3. The microelectronic unit of claim 1, wherein said electrically conductive material comprises:
a plurality of solder balls.

4. The microelectronic unit of claim 1, further comprising:
a through via extending through said microelectronic unit;
second thermally conductive material filling said through via; and
second electrically conductive material connected to said mesh and to said second thermally conductive material.

5. A microelectronic unit, comprising:
a semiconductor element having a top surface and a bottom surface remote from said top surface;
a semiconductor device adjacent to said top surface;
one or more first blind vias extending from said bottom surface and partially into a thickness of said semiconductor element;
a thermally conductive material filling said one or more first blind vias for heat dissipation
electrically conductive material placed in contact with said thermally conductive material, wherein said thermally conductive material is also electrically conductive, and wherein said electrically conductive material is configured such that adjacent portions of electrically conductive material are interconnected in a mesh structure;
a second semiconductor element having a second top surface and a second bottom surface remote from said second top surface;
a second semiconductor device adjacent to said second top surface;
a dielectric element adjacent to said second semiconductor device, said dielectric element having a front surface remote from said second semiconductor device;
one or more second blind vias extending from said front surface and partially into a thickness of said dielectric element;
second thermally conductive material filling each of said one or more second blind vias; and
second electrically conductive material connected to said second thermally conductive material, wherein said semiconductor device and said second semiconductor device are stacked in the same orientation such that that said electrically conductive material and said second electrically conductive material are in contact to form a second mesh structure.

6. The microelectronic unit of claim 1, further comprising:
a package including said semiconductor device, wherein the mesh is electrically coupled to one or more terminals leading externally to said package.

7. The microelectronic unit of claim 1, further comprising:
a barrier metal lining at least one of said one or more first blind vias and separating said thermally conductive material from said semiconductor element.

8. The microelectronic unit of claim 1, wherein said semiconductor device comprises a DRAM array.

9. A multi-chip packaged unit, comprising:
a plurality of semiconductor chips stacked and joined together, at least one chip comprising:
a semiconductor element having a top surface and a bottom surface remote from said top surface;
a semiconductor device adjacent to said top surface;
one or more first blind vias extending from said bottom surface and partially into a thickness of said semiconductor element; and
a thermally conductive material filling each of said one or more first blind vias for heat dissipation; and
electrically conductive material placed in contact with said thermally conductive material filling said one or more first blind vias, and configured such that adjacent electrically conductive material are interconnected to form a mesh structure;
a dielectric element adjacent said semiconductor device, said dielectric element having a front surface remote from said semiconductor device;
one or more second blind vias extending from said front surface and partially into a thickness of said dielectric element;
a second thermally conductive material filling each of said one or more second blind vias; and
second electrically conductive material connected with said second thermally conductive material, and configured such that adjacent second electrically conductive material are interconnected to form a second mesh structure; and wherein adjacent chips that are stacked are configured such that a corresponding first mesh structure is connected to a corresponding second mesh structure.

10. The microelectronic unit of claim 9, wherein said electrically conductive material comprises:
a plurality of solder balls.

11. The microelectronic unit of claim 9, further comprising:
a plurality of through vias each extending through a corresponding semiconductor chip and filled with corresponding second thermally conductive material; and
a second electrically conductive material electrically coupling together at least two of the plurality of through vias, wherein the second electrically conductive material is connected to a corresponding second thermally conductive material and to a corresponding mesh structure.

12. The microelectronic unit of claim 9, wherein each chip further comprises:
an insulating layer adjacent to said bottom surface, said insulating layer having a rear surface remote from said bottom surface, wherein said one or more first blind vias extends from said rear surface and through the insulating layer and into said semiconductor element.

* * * * *